US012713591B2

(12) United States Patent
Park et al.

(10) Patent No.: US 12,713,591 B2
(45) Date of Patent: Aug. 18, 2026

(54) SEMICONDUCTOR MEMORY DEVICES

(71) Applicant: SAMSUNG ELECTRONICS CO., LTD., Suwon-si (KR)

(72) Inventors: Tae Jin Park, Suwon-si (KR); Hui Jung Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 439 days.

(21) Appl. No.: 18/525,235

(22) Filed: Nov. 30, 2023

(65) Prior Publication Data

US 2024/0357802 A1 Oct. 24, 2024

(30) Foreign Application Priority Data

Apr. 20, 2023 (KR) ........................ 10-2023-0051746

(51) Int. Cl.
*H10B 12/00* (2023.01)

(52) U.S. Cl.
CPC ....... *H10B 12/485* (2023.02); *H10B 12/0335* (2023.02); *H10B 12/053* (2023.02); *H10B 12/315* (2023.02); *H10B 12/34* (2023.02); *H10B 12/482* (2023.02)

(58) Field of Classification Search
CPC .............. H10B 12/033; H10B 12/0335; H10B 12/053; H10B 12/31; H10B 12/315; H10B 12/34; H10B 12/37; H10B 12/482; H10B 12/485; H10B 12/50
See application file for complete search history.

(56) References Cited

U.S. PATENT DOCUMENTS 6,329,680 B1 * 12/2001 Yoshida ................. H10B 12/09
257/E21.654
7,462,899 B2 * 12/2008 Seo .................. H10W 20/0698
257/E21.507
9,356,073 B1 5/2016 Kim
(Continued)

FOREIGN PATENT DOCUMENTS

GB 2231718 A 11/1990
JP 2016082182 A * 5/2016
(Continued)

*Primary Examiner* — Matthew E Warren
(74) *Attorney, Agent, or Firm* — Wolf, Greenfield & Sacks, P.C.

(57) ABSTRACT

A semiconductor memory device comprising: a substrate including active patterns; a gate structure intersecting the active patterns; bit-line structures on the substrate; first contacts, wherein the bit-line structures and the first contacts are alternately arranged with each other; insulating patterns respectively disposed on the bit-line structures, wherein an insulating pattern among the insulating patterns is disposed in a first trench exposing a sidewall of a first contact among the first contacts and at least a portion of the gate structure; and second contacts disposed on the first contacts, wherein a second contact among the second contacts is disposed in a second trench exposing a sidewall of the insulating pattern and an upper surface of the first contact, wherein the insulating pattern overlaps an upper surface of a bit-line structure among the bit-line structures and extends along sidewalls of the first and second trenches and contacts the first and second contacts.

20 Claims, 50 Drawing Sheets

(56) References Cited

U.S. PATENT DOCUMENTS

| | | | | |
|---|---|---|---|---|
| 9,390,961 | B2 | 7/2016 | Lee et al. | |
| 9,786,598 | B2 | 10/2017 | Kim et al. | |
| 11,217,587 | B2 | 1/2022 | Ikeda | |
| 2013/0161781 | A1* | 6/2013 | Lee | H10B 12/0335 257/499 |
| 2020/0194374 | A1* | 6/2020 | Kim | H10W 20/069 |
| 2022/0037251 | A1 | 2/2022 | Park et al. | |
| 2022/0059543 | A1 | 2/2022 | Mun et al. | |
| 2024/0172421 | A1* | 5/2024 | Kim | H10B 12/315 |

FOREIGN PATENT DOCUMENTS

| | | | | | |
|---|---|---|---|---|---|
| KR | 900019141 | A | | 12/1990 | |
| KR | 20160089095 | A | * | 7/2016 | H10W 20/089 |
| KR | 20190035250 | A | * | 4/2019 | H10W 20/47 |
| WO | WO-2022062547 | A1 | * | 3/2002 | H10B 12/30 |
| WO | WO-2014109310 | A1 | * | 7/2014 | H10B 12/0335 |

* cited by examiner

SEMICONDUCTOR MEMORY DEVICES

CROSS-REFERENCE TO RELATED APPLICATION

This application claims priority from Korean Patent Application No. 10-2023-0051746 filed on Apr. 20, 2023 in the Korean Intellectual Property Office, and all the benefits accruing therefrom under 35 U.S.C. 119, the contents of which in its entirety are herein incorporated by reference.

BACKGROUND

The present disclosure relates to semiconductor memory devices.

As semiconductor devices become increasingly highly integrated, individual circuit patterns are becoming more miniaturized to implement a larger number of semiconductor devices in the same area. That is, as integration levels of the semiconductor devices increase, design rules for components of the semiconductor devices decrease.

The semiconductor devices may include word-line and bit-line structures. As the semiconductor devices become highly integrated, an aspect ratio of each of the bit-line structures may increase. In this case, the need to solve a problem caused by the increase in the aspect ratio of each of the bit-line structures is increasing.

SUMMARY

Embodiments of the present disclosure provide semiconductor memory devices with improved reliability and performance.

One aspect of the present disclosure provides a semiconductor memory device comprising: a semiconductor memory device comprising: a substrate including a plurality of active patterns; a gate structure that extends into the substrate, wherein the gate structure extends in a first direction to intersect the plurality of active patterns; a plurality of bit-line structures on the substrate, wherein a bit-line structure among the plurality of bit-line structures extends in a second direction that intersects the first direction; a plurality of first contacts, wherein the plurality of bit-line structures and the plurality of first contacts are alternately arranged with each other in the first direction; a plurality of insulating patterns respectively disposed on the plurality of bit-line structures, wherein an insulating pattern among the plurality of the insulating patterns is disposed in a first trench exposing a sidewall of a first contact among the plurality of first contacts and at least a portion of the gate structure; and a plurality of second contacts respectively disposed on the plurality of first contacts, wherein a second contact among the plurality of second contacts is disposed in a second trench exposing a sidewall of the insulating pattern and an upper surface of the first contact, wherein the first and second directions are parallel with an upper surface of the substrate, and wherein the insulating pattern overlaps an upper surface of the bit-line structure and extends along a sidewall of each of the first and second trenches and contacts each of the first and second contacts.

Another aspect of the present disclosure provides a semiconductor memory device comprising: a substrate including active patterns that include respective source/drain areas; gate structures in the substrate, wherein the gate structures extend in a first direction and intersect the active patterns; bit-line structures on the substrate, wherein the bit-line structures extend in a second direction that intersects the first direction; a first contact between adjacent ones of the bit-line structures, wherein the first contact is electrically connected to one of the respective source/drain areas; an insulating pattern on a bit-line structure among the bit-line structures, wherein the insulating pattern is in a first trench that exposes a sidewall of the first contact and a portion of a gate structure among the gate structures; and a second contact on the first contact, wherein the second contact is in a second trench that exposes a sidewall of the insulating pattern and an upper surface of the first contact, wherein the first and second directions are parallel with an upper surface of the substrate, wherein the insulating pattern includes: a first area in contact with the first contact; and a second area that is on the first area and in contact with the second contact, wherein the second area is in contact with an upper surface of the bit-line structure, and wherein the first and second areas are respectively on sidewalls of the first and second trenches and respectively extend along the sidewalls of the first and second trenches.

Still another aspect of the present disclosure provides a semiconductor memory device comprising: a substrate including a plurality of active patterns that include respective first source/drain area and respective second source/drain area; an insulating film on the substrate; a gate structure in the substrate, wherein the gate structure extends in a first direction to intersect the plurality of active patterns; a bit-line structure on the insulating film, wherein the bit-line structure extends in a second direction that intersects the first direction, and wherein the bit-line structure extends through the insulating film to be electrically connected to the respective first source/drain area; a first contact spaced apart from the bit-line structure in the first direction, wherein the first contact is electrically connected to the respective second source/drain area; an insulating pattern on an upper surface of the bit-line structure and an upper surface of the gate structure; and a second contact on the first contact, wherein the second contact is electrically connected to the first contact, wherein the first and second directions are parallel with an upper surface of the substrate, wherein the insulating pattern overlaps the bit-line structure in a third direction and extends to the upper surface of the gate structure, wherein the third direction is perpendicular to the upper surface of the substrate, and wherein the insulating pattern is in contact with the first and second contacts.

Embodiments according to the present disclosure are not limited to the above-mentioned embodiments. Other embodiments and advantages that are not mentioned according to the present disclosure may be understood based on following descriptions, and may be more clearly understood based on embodiments taken in conjunction with the accompanying drawings according to the present disclosure. Further, it will be understood that the embodiments and advantages according to the present disclosure may be realized using means shown in the claims and combinations thereof.

Other specifics of the present disclosure are included in the detailed descriptions and drawings.

BRIEF DESCRIPTION OF DRAWINGS

The above and other aspects and features of the present disclosure will become more apparent by describing in detail illustrative embodiments thereof with reference to the attached drawings, in which.

DETAILED DESCRIPTIONS

Figure 1:
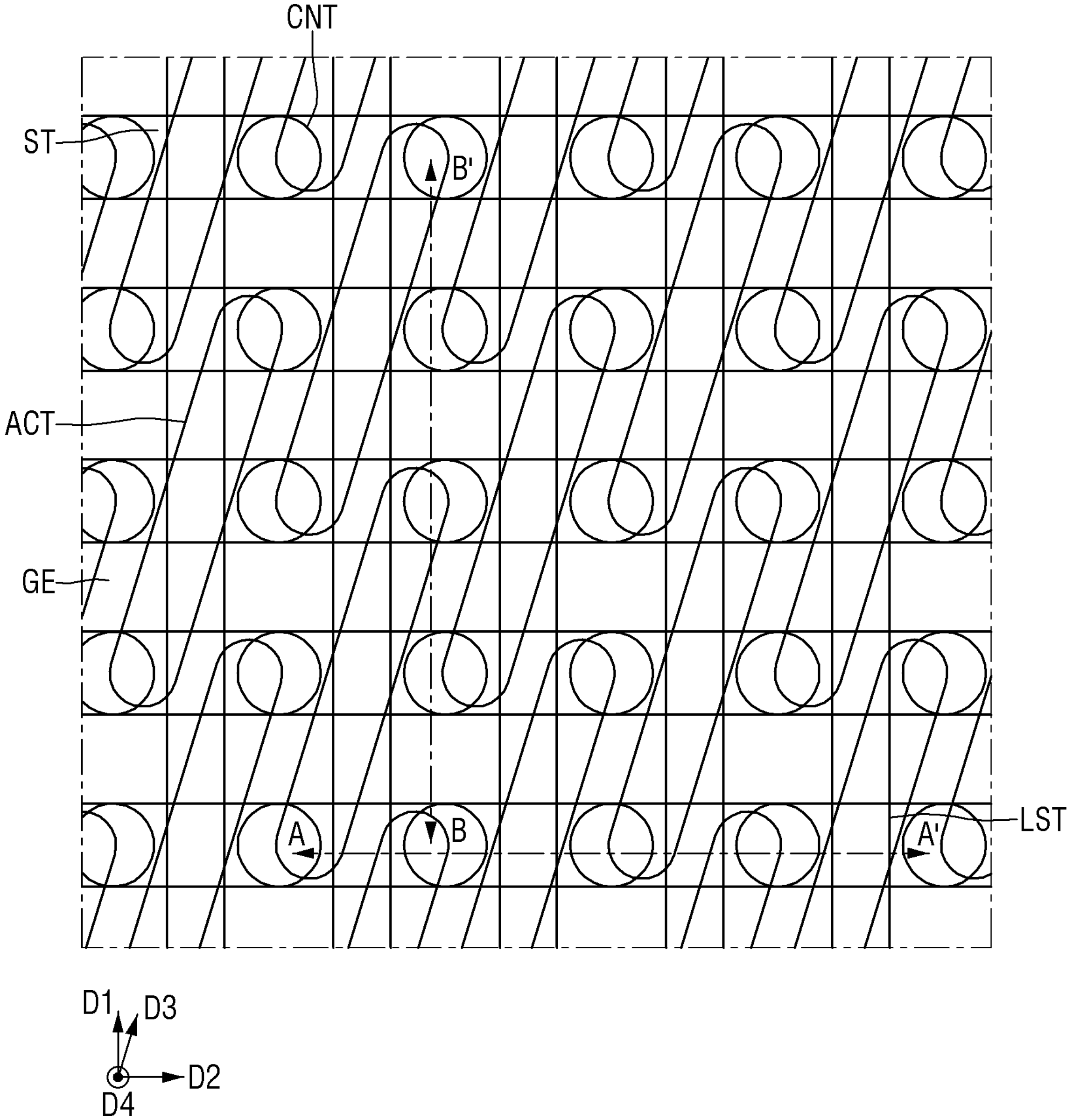
FIG. 1 is a schematic layout diagram of a semiconductor memory device according to some embodiments.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be included in the idea and scope of the present disclosure as defined by the appended claims.

A shape, a size, a ratio, an angle, a number, etc. disclosed in the drawings for illustrating embodiments of the present disclosure are illustrative, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entirety of list of elements and may not modify the individual elements of the list. When referring to "C to D", this means C inclusive to D inclusive unless otherwise specified.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described under could be termed a second element, component, region, layer or section, without departing from the idea and scope of the present disclosure.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In contrast, when an element is referred to as being "directly coupled," "directly connected," or "directly responsive" to, or "directly on," another element, there are no intervening elements present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like may be disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like may be disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one example, when a certain embodiment may be implemented differently, a function or operation specified in a specific block may occur in a sequence different from that specified in a flowchart. For example, two consecutive blocks may actually be executed at the same time. Depending on a related function or operation, the blocks may be executed in a reverse sequence.

In descriptions of temporal relationships, for example, temporal precedent relationships between two events such as "after", "subsequent to", "before", etc., another event may occur therebetween unless "directly after", "directly subsequent" or "directly before" is not indicated.

The features of the various embodiments of the present disclosure may be partially or entirely combined with each other, and may be technically associated with each other or operate with each other. The embodiments may be implemented independently of each other and may be implemented together in an association relationship.

Spatially relative terms, such as "beneath," "below," "lower," "under," "above," "upper," and the like, may be used herein for ease of explanation to describe one element or feature's relationship to another element or feature as illustrated in the figures. It will be understood that the spatially relative terms are intended to encompass different orientations of the device in use or in operation, in addition to the orientation depicted in the figures. For example, when the device in the drawings may be turned over, elements described as "below" or "beneath" or "under" other elements or features would then be oriented "above" the other elements or features. Thus, the example terms "below" and "under" may encompass both an orientation of above and below. The device may be otherwise oriented, for example, rotated 90 degrees or at other orientations, and the spatially relative descriptors used herein should be interpreted accordingly.

Figure 2A:
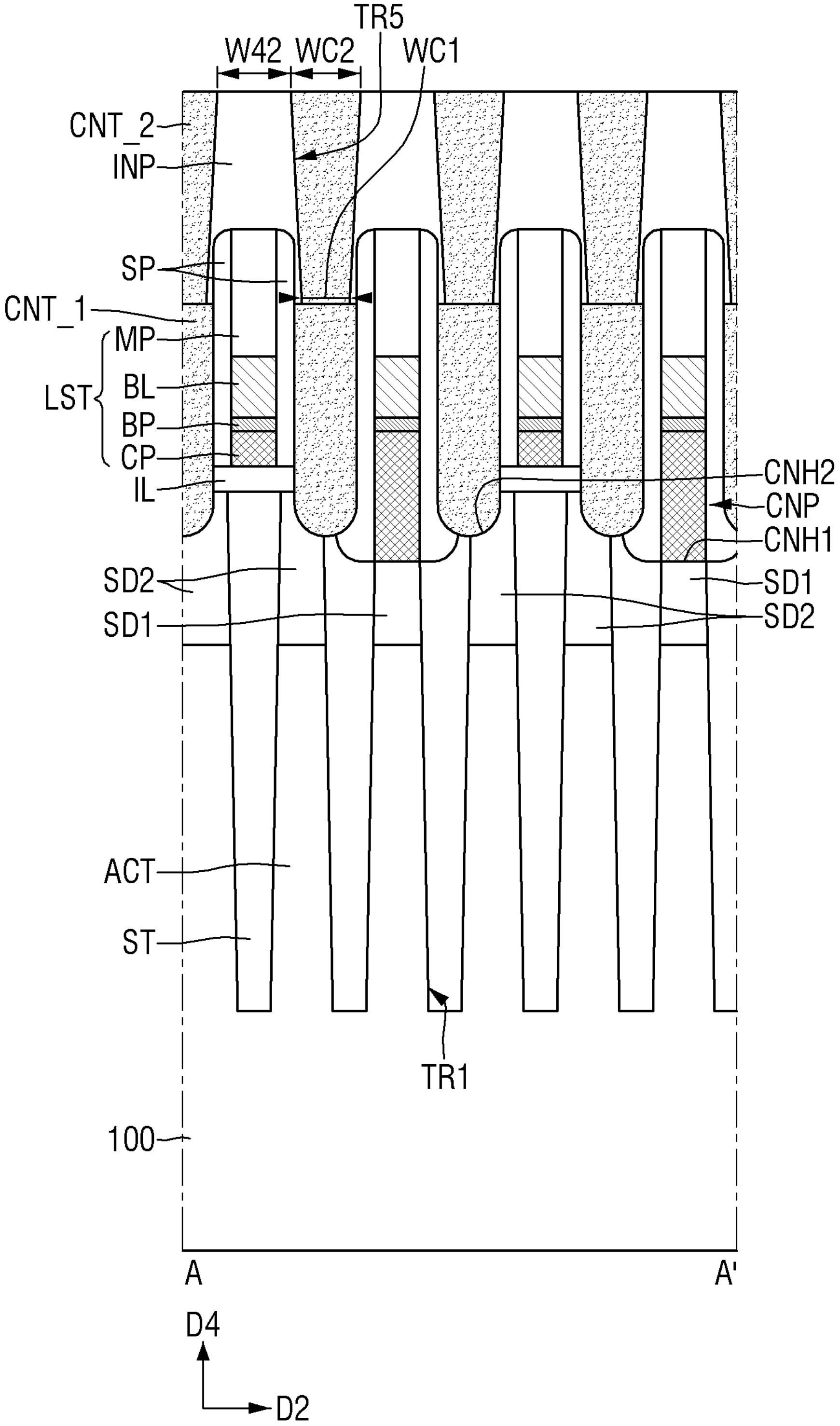
FIG. 2A is an illustrative cross-sectional view taken along a line A-A' of FIG. 1.
Figure 2B:
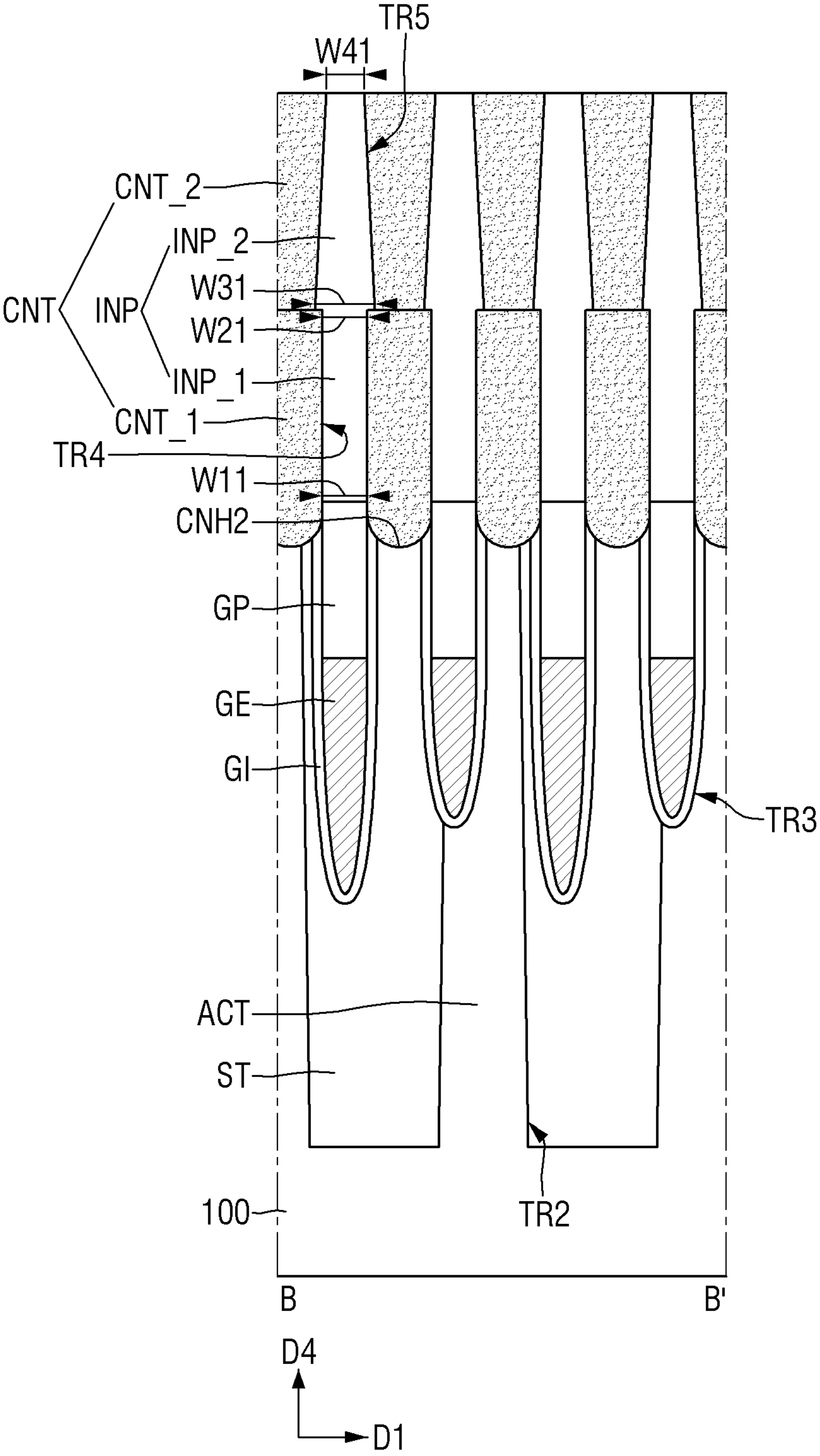
FIG. 2B is an illustrative cross-sectional view taken along line B-B' of FIG. 1.
Figure 3:
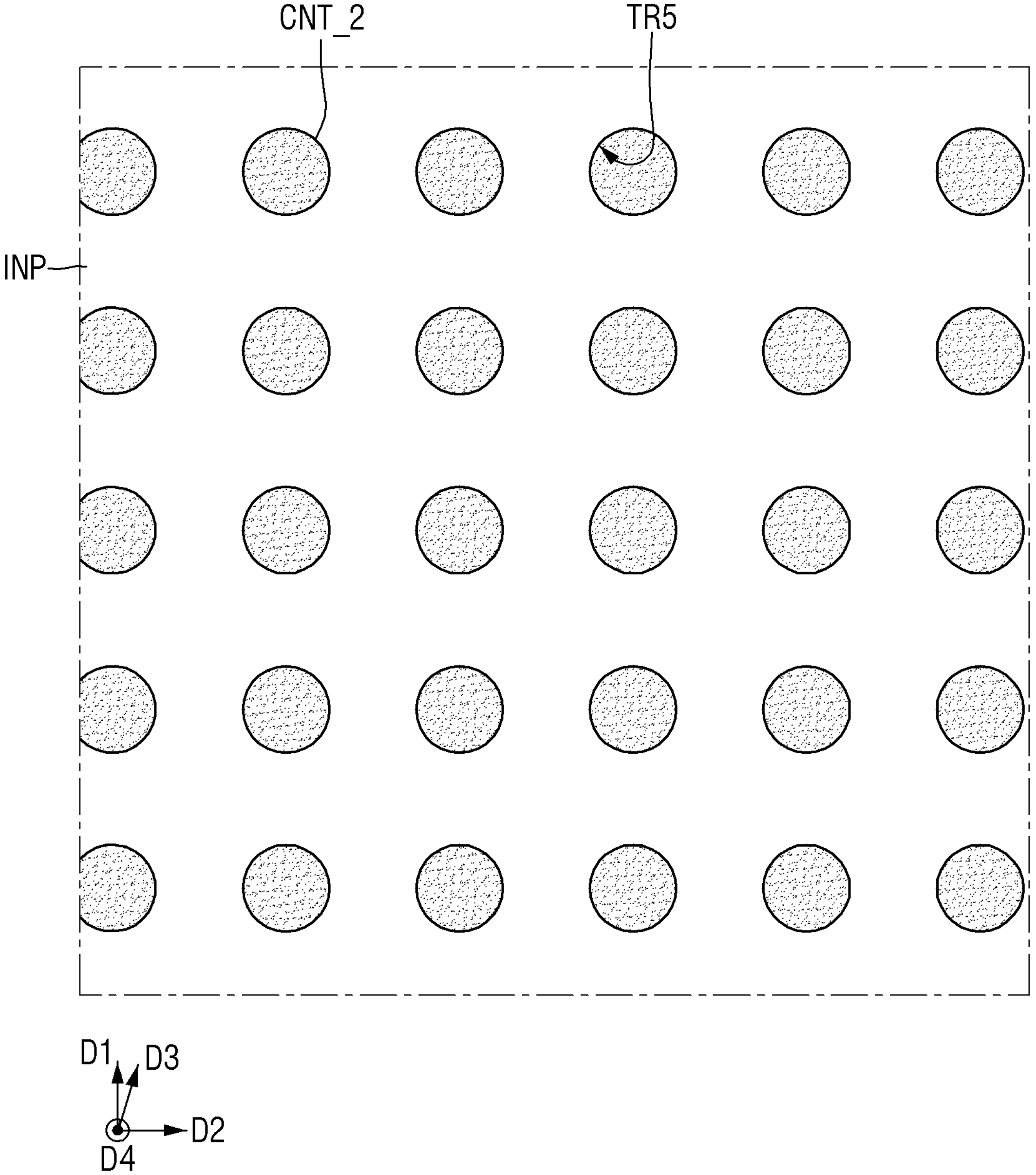
FIG. 3 is a top view of a semiconductor memory device according to some embodiments.

FIG. 1 is a schematic layout diagram of a semiconductor memory device according to some embodiments. FIG. 2A is an illustrative cross-sectional view taken along a line A-A' of FIG. 1. FIG. 2B is an illustrative cross-sectional view taken along a line B-B' of FIG. 1. FIG. 3 is a top view of a semiconductor memory device according to some embodiments. For reference, FIG. 3 may be a plan view (e.g., a top view) of the semiconductor memory device of FIGS. 27A and 27B.

In the drawings of the semiconductor memory device according to some embodiments, a DRAM (dynamic random access memory) is shown by way of example. However, the present disclosure is not limited thereto.

Referring to FIG. 1 to FIG. 3, an element isolation film ST defining active patterns ACT may be disposed in a substrate 100. For example, the element isolation film ST may be adjacent the active patterns ACT. The element isolation film ST and the active patterns ACT may be disposed in the substrate 100. In some embodiments, the substrate 100 may include, for example, a semiconductor substrate, such as silicon, germanium, and/or silicon-germanium. The element isolation film ST may include, for example, a silicon oxide film.

The active patterns ACT may be formed by patterning an upper portion of the substrate 100. According to the reduction of the design rule of the semiconductor memory device, each of the active patterns ACT may extend in a form of a bar in a diagonal direction or an oblique direction. Each of the active patterns ACT may extend in a third direction D3 that is a horizontal direction parallel with an upper surface of the substrate 100. In other words, each of the active patterns ACT may have a major axis in the third direction D3. In a plan view, the active patterns ACT may be two-dimensionally arranged in a first direction D1 and a second direction D2. The active patterns ACT may be spaced apart from each other in the third direction D3. The first direction D1 and the second direction D2 may be horizontal directions parallel with the upper surface of the substrate 100. The first direction D1 and the second direction D2 may intersect (e.g., may be perpendicular) to each other. In some embodiments, the third direction D3 may have an acute angle θ with respect to the first direction D1 and/or the second direction D2. The acute angle θ may be, for example, about 60°. However, the present disclosure is not limited thereto.

A width of each of the active patterns ACT may decrease as each of the active patterns ACT extends upwardly in a direction perpendicular to the upper surface of the substrate 100, that is, in a fourth direction D4. In other words, the width of each of the active patterns ACT may decrease as each of the active patterns ACT extends away from a lower surface of the substrate 100. The fourth direction D4 may be a vertical direction perpendicular to the first direction D1 and the second direction D2.

Between the active patterns ACT, first and second trenches TR1 and TR2 may be disposed (e.g., defined). The element isolation film ST may fill (e.g., at least partially fill) the first and second trenches TR1 and TR2 between the active patterns ACT. The first trench TR1 may be disposed between (e.g., defined by) a pair of active patterns ACT adjacent to each other in the second direction D2. The second trench TR2 may be disposed between (e.g., defined by) a pair of active patterns ACT adjacent to each other in the third direction D3.

A distance between the pair of active patterns ACT adjacent to each other in the second direction D2 may be smaller than a distance between the pair of active patterns ACT adjacent to each other in the third direction D3. In some embodiments, the second trench TR2 may be deeper than the first trench TR1. For example, a vertical level of a lower surface of the second trench TR2 may be lower than that of a lower surface of the first trench TR1. A vertical level of an element herein may refer to a distance of the element from a lower surface of the substrate 100 in a vertical direction (e.g., the fourth direction D4). In other words, the lower surface of the second trench TR2 may be closer than that of the lower surface of the first trench TR1 to the lower surface of the substrate 100.

An upper portion of each of the active patterns ACT may include a first source/drain area SD1 and a pair of second source/drain areas SD2. The first source/drain area SD1 may be positioned between the pair of the second source/drain areas SD2. In some embodiments, in a plan view, the second source/drain area SD2, the first source/drain area SD1, and the second source/drain area SD2 may be sequentially arranged along the third direction D3.

A pair of third trenches TR3 may be disposed for each of the active patterns ACT. Each of the third trenches TR3 may be disposed between the first source/drain area SD1 and the second source/drain area SD2. The third trench TR3 may extend through the upper portion of the active pattern ACT and may extend downwardly from an upper surface of the active pattern ACT toward the lower surface of the substrate 100. A vertical level of a lower surface of the third trench TR3 may be higher than that of the lower surface of each of the first and second trenches TR1 and TR2. For example, the lower surface of the third trench TR3 may be farther than the lower surface of each of the first and second trenches TR1 and TR2 from the lower surface of the substrate 100.

Although not specifically shown, the upper portion of each of the active patterns ACT may further include a pair of channel areas. In a plan view, the channel area may be disposed between the first source/drain area SD1 and the second source/drain area SD2.

Gate electrodes GE extending across the active patterns ACT and the element isolation film ST may be provided. The gate electrode GE may be referred to as a 'word-line'. A width of each of the word-lines or a spacing between the word-lines may be determined according to the design rule. Although not specifically shown, the word-line may extend (e.g., in an elongate manner) in the second direction D2 and may be disposed in a word-line trench extending across the active pattern ACT.

Two word-lines extending in the second direction D2 may divide each active pattern ACT into three portions. The three portions of the active pattern ACT may include one first portion and two second portions. The first portion of the active pattern ACT many be positioned in a middle area of the active pattern ACT, while the two second portions of the active pattern ACT may be respectively disposed (e.g., defined) on both opposing sides of the first portion and may be respectively positioned at both opposing ends of the active pattern ACT. The word-line may be disposed between the first portion of the active pattern ACT and each of the second portions of the active pattern ACT.

For example, the first portion of the active pattern ACT may be electrically connected (e.g., connected) to a bit-line, and the second portion of the active pattern ACT may be electrically connected (e.g., connected) to a capacitor as described later. That is, the first portion of the active pattern ACT may be electrically connected (e.g., connected) to a bit-line structure LST, and the second portion of the active pattern ACT may be electrically connected (e.g., connected) to a contact CNT. In some embodiments, the first portion of the active pattern ACT may correspond to a common drain area, and the second portion of the active pattern ACT may correspond to a source area. Each word-line and the first and second portions of the active pattern ACT adjacent thereto may constitute a transistor.

An end of one active pattern ACT (e.g., the second portion of an active pattern ACT) may be disposed to be adjacent to a center of another active pattern ACT (e.g., the first portion of another active pattern ACT) adjacent thereto. The end of one active pattern ACT (e.g., the second portion of an active pattern ACT) may be adjacent to the center of another active pattern ACT (e.g., the first portion of another active pattern ACT) adjacent thereto in the second direction D2. Specifically, an end of one active pattern ACT (e.g., the second portion of an active pattern ACT) connected to the contact CNT may be spaced apart from a center of one active pattern ACT (e.g., the first portion of another active pattern ACT) connected to the bit-line structure LST in the second direction D2.

The gate electrode GE may be disposed between an end of one active pattern ACT (e.g., the second portion of an active pattern ACT) and an end of another active pattern ACT (e.g., the second portion of another active pattern ACT) adjacent thereto in the first direction D1. The bit-line structure LST may be disposed between an end of one active pattern ACT (e.g., the second portion of an active pattern ACT) and an end of another active pattern ACT (e.g., the second portion of another active pattern ACT) adjacent thereto in the second direction D2.

The gate electrodes GE may be disposed in the third trenches TR3, respectively. The gate electrodes GE may extend in a parallel manner to each other and in the second direction D2. In a plan view, the gate electrode GE may be disposed (e.g., interposed) between the first source/drain area SD1 and the second source/drain area SD2. A vertical level of an upper surface of the gate electrode GE may be lower than that of the upper surface of the active pattern ACT, for example, an upper surface of the first source/drain area SD1 and/or an upper surface of the second source/drain area SD2.

A gate dielectric film GI may be disposed (e.g., interposed) between the gate electrode GE and the active pattern ACT. A gate capping film GP may be disposed on the gate electrode GE. The gate capping film GP may cover or overlap (e.g., overlap in the fourth direction D4) the upper surface of the gate electrode GE. An upper surface of the gate capping film GP may be coplanar with the upper surface of the active pattern ACT.

The gate electrode GE may include, for example, a conductive metal nitride such as titanium nitride or tantalum nitride, and/or a metal material such as titanium, tantalum, tungsten, copper, or aluminum. However, the present disclosure is not limited thereto. The gate dielectric film GI may include, for example, a silicon oxide film, a silicon nitride film, a silicon oxynitride film, and/or a film made of a high dielectric constant material. However, the present disclosure is not limited thereto. The high dielectric constant material may include, for example, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and/or combinations thereof. However, the present disclosure is not limited thereto. The gate capping film GP may include, for example, a silicon oxide film, a silicon nitride film, and/or a silicon oxynitride film. However, the present disclosure is not limited thereto.

An insulating film IL may be disposed on the substrate 100. The insulating film IL may have first contact-holes CNH1 defined therein exposing the first source/drain areas SD1 of the active patterns ACT. In some embodiments, the insulating film IL may be a single layer or a stack of multiple layers. For example, the insulating film IL may include silicon oxide and silicon oxynitride layers sequentially stacked.

The bit-line structures LST extending in a parallel manner to each other and in the first direction D1 may be disposed on the insulating film IL. The bit-line structures LST may be arranged so as to be spaced apart from each other in the second direction D2. In a plan view, the bit-line structures LST may perpendicularly intersect the gate electrodes GE. A pair of spacers SP may be respectively disposed on both opposing sidewalls of each of the bit-line structures LST. Each of the spacers SP may include, for example, a silicon oxide layer, a silicon nitride layer, and/or a silicon oxynitride layer.

Each of the bit-line structures LST may include a conductive pattern CP, a barrier pattern BP, a bit-line BL, and a mask pattern MP which are sequentially stacked. The conductive pattern CP may be disposed in the first contact-hole CNH1 and may include a bit-line contact CNP electrically connected (e.g., connected) to the first source/drain area SD1. More specifically, the bit-line contact CNP may extend through the insulating film IL (e.g., extend through the insulating film IL through the first contact-hole CNH1) and extend toward the lower surface of the substrate 100. The bit-line contact CNP may directly contact the first source/drain area SD1.

The barrier pattern BP may suppress diffusion of a metal material in the bit-line BL to the conductive pattern CP. The bit-line BL may be electrically connected to the first source/drain area SD1 via the barrier pattern BP and the conductive pattern CP.

The conductive pattern CP may include, for example, a doped semiconductor material, such as doped silicon or doped germanium. The barrier pattern BP may include, for example, a conductive metal nitride, such as titanium nitride and/or tantalum nitride. The bit-line BL may include, for example, metal material. For example, the bit-line BL may include molybdenum (Mo) and/or ruthenium (Ru). In some embodiments, the bit-line BL may include, for example, titanium, tantalum, tungsten, copper, and/or aluminum.

Figure 17A:
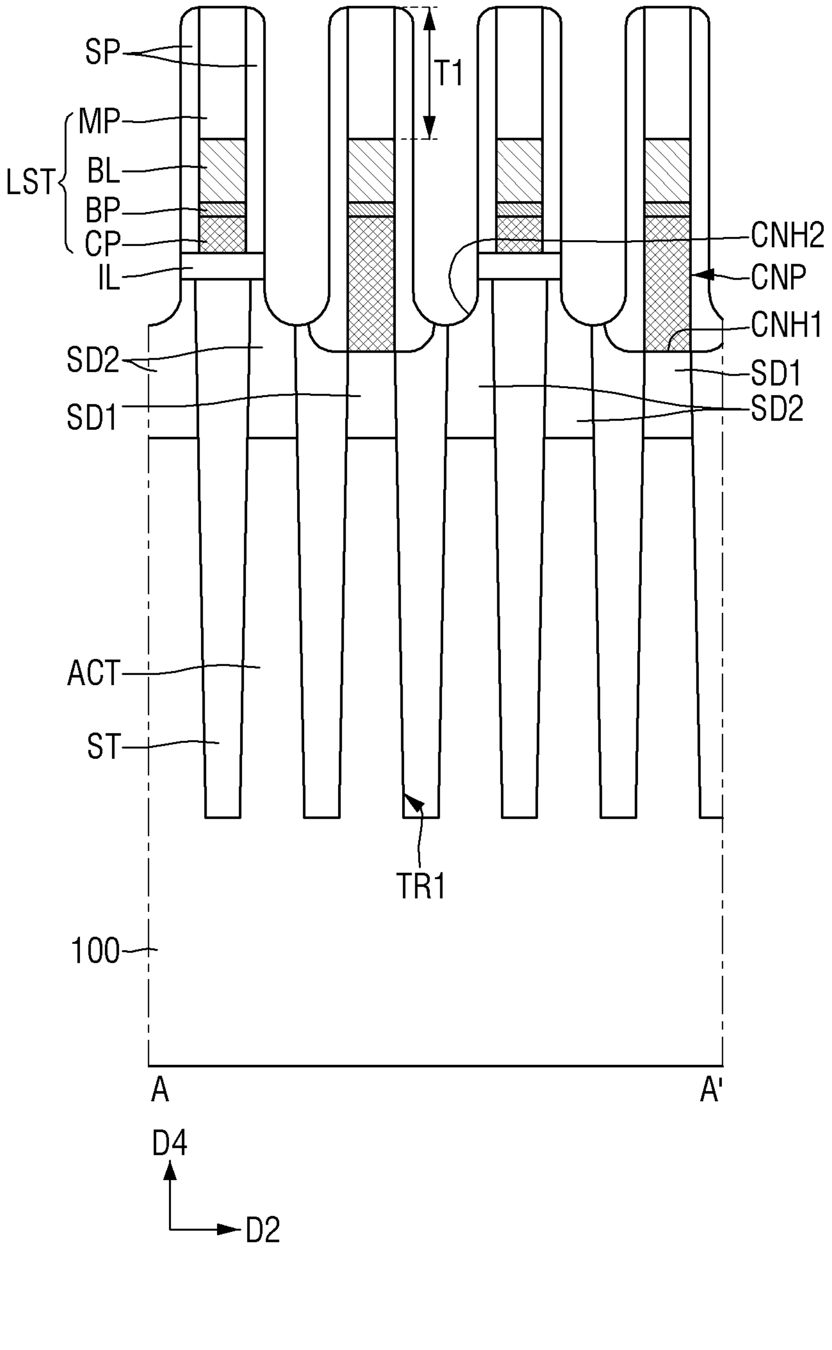

The mask pattern MP may be disposed on the bit-line BL. An upper surface of the mask pattern MP may be flat. Referring to FIG. 2A and FIG. 17A together, a thickness T1 of the mask pattern MP in the fourth direction D4 may be, for example, in a range of 150 Å to 450 Å. However, the present disclosure is not limited thereto.

In some embodiments, the gate electrode GE, the gate dielectric film GI, and the gate capping film GP may be collectively referred to as a gate structure.

Referring to FIG. 2A, FIG. 2B, and FIG. 3, an insulating pattern INP may be disposed on the gate capping film GP. The insulating pattern INP may extend to a top (e.g., upper surface) of the gate capping film GP.

The contacts CNT may be arranged two-dimensionally along the first direction D1 and the second direction D2. The insulating pattern INP may be disposed on an area of the gate capping film GP on which the contacts CNT are not disposed.

Referring again to FIGS. 2A and 2B, the contacts CNT extending through the insulating film IL so as to be respectively electrically connected (e.g., connected) to the second source/drain areas SD2 may be provided. The contacts CNT and the bit-line structures LST may be alternately arranged with each other along the second direction D2. The contacts CNT and the insulating patterns INP may be alternately arranged with each other along the first direction D1 and the second direction D2.

The contact CNT may also be referred to as 'a storage node contact'. Each of the contacts CNT may include a first contact CNT_1 and a second contact CNT_2 disposed on the first contact CNT_1. For example, a plurality of second contacts CNT_2 may be respectively disposed on a plurality of first contacts CNT_1.

The first contact CNT_1 may fill (e.g., at least partially fill) a second contact-hole CNH2 formed by partially etching an upper portion of the second source/drain area SD2. Referring back to FIG. 2A, the first contact CNT_1 may directly contact the second source/drain area SD2 exposed through the second contact-hole CNH2. Further, the first contact CNT_1 may contact a sidewall of spacer SP and an upper surface of the element isolation film ST. The first contact CNT_1 may be spaced apart from the bit-line BL adjacent thereto via the spacer SP. For example, the first contact CNT_1 may be between adjacent ones of the bit-line structures LST (e.g., adjacent ones of the bit-lines BL). The first contact CNT_1 may include, for example, a doped semiconductor material, such as doped silicon and/or doped germanium, and/or a metal, such as titanium, tantalum, tungsten, copper, and/or aluminum.

The second contact CNT_2 contacting the first contact CNT_1 may be disposed on the first contact CNT_1. The second contact CNT_2 may be electrically connected to the second source/drain areas SD2 via the first contact CNT_1. The second contact CNT_2 may be aligned with the first contact CNT_1. For example, second contacts CNT_2 may overlap the first contacts CNT_1 in the fourth direction D4, respectively. The second contact CNT_2 may include, for example, a doped semiconductor material such as doped silicon and/or doped germanium, and/or a metal such as titanium, tantalum, tungsten, copper, and/or aluminum.

The insulating pattern INP may be disposed on the mask patterns MP. The insulating pattern INP may define a planar shape of the second contact CNT_2. Due to the insulating pattern INP, adjacent second contacts CNT_2 may be isolated from each other.

Although not specifically shown, an information storage element may be disposed on the second contact CNT_2. Specifically, the information storage element may include first electrodes respectively disposed on the second contacts CNT_2. The first electrodes may be respectively electrically connected (e.g., connected) to the second contacts CNT_2. The information storage element may further include a second electrode disposed on the first electrodes and a dielectric film disposed between the first electrodes and the second electrode. The first electrode, the dielectric film, and the second electrode may constitute a capacitor for storing data therein.

Each of the first electrodes may have a solid pillar shape. However, the present disclosure is not limited thereto. In some embodiments, each of the first electrodes may have a cylindrical shape with a closed bottom. A plurality of first electrodes may be arranged in a zigzag pattern along the first direction D1 or the second direction D2 and thus may have a honeycomb arrangement. In some embodiments, the plurality of first electrodes may be arranged in a matrix form along the first direction D1 and the second direction D2.

For example, each of the first electrodes may include, for example, silicon doped with impurities, a metal such, as tungsten, and/or a conductive metal compound, such as titanium nitride. The dielectric film may include, for example, a high dielectric constant material. The high dielectric constant material may include, for example, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and/or combinations thereof. However, the present disclosure is not limited thereto. The second electrode may include, for example, doped silicon, Ru, RuO, Pt, PtO, Ir, IrO, SRO (SrRuO), BSRO ((Ba,Sr) RuO), CRO (CaRuO), BaRuO, La(Sr,Co)O, Ti, TiN, W, WN, Ta, TaN, TiAlN, TiSiN, TaAlN, TaSiN, and/or a combination thereof. However, the present disclosure is not limited thereto.

Referring to FIG. 2A and FIG. 2B, the contact CNT and the insulating pattern INP are described in more detail.

The insulating pattern INP may be disposed on the bit-line structure LST. For example, a plurality of insulating patterns INP may be respectively disposed on a plurality of bit-line structures LST. The insulating pattern INP may fill (e.g., at least partially fill) a fourth trench TR4 exposing a sidewall of the first contact CNT_1 and at least a portion of the gate capping film GP.

The second contact CNT_2 may be disposed on the first contact CNT_1. The second contact CNT_2 may fill (e.g., at least partially fill) a fifth trench TR5 exposing a sidewall of the insulating pattern INP and an upper surface of the first contact CNT_1. Referring to FIG. 2A and FIG. 2B, a width of the fifth trench TR5 along each of the first and second directions D1 and D2 may increase as the fifth trench TR5 extends away from the substrate 100. The second contact CNT_2 may be electrically connected to the first contact CNT_1.

The insulating pattern INP may include a first area INP_1 disposed between adjacent first contacts CNT_1 and a second area INP_2 disposed between adjacent second contacts CNT_2. The first area INP_1 may contact the first contact CNT_1, and the second area INP_2 may be disposed on the first area INP_1 and may contact the second contact CNT_2. The first area INP_1 and the second area INP_2 may overlap each other in the fourth direction D4.

The bit-line structure LST and the insulating pattern INP may overlap each other in the fourth direction D4. In other words, the bit-line structure LST and the insulating pattern INP may be aligned with each other in the fourth direction D4. Accordingly, the second area INP_2 may cover or overlap (e.g., overlap in the fourth direction D4) the upper surface of the bit-line structure LST. The second area INP_2 may contact an entirety of the upper surface of the bit-line structure LST. The first and second area INP_1 and INP_2 may respectively extend along sidewalls of the fourth and fifth trenches TR4 and TR5 while being disposed on the sidewalls of the fourth and fifth trenches TR4 and TR5, respectively.

A slope of the sidewall of the second trench TR4 and a slope of the sidewall of the third trench TR5 may be different from each other. Accordingly, a shape (e.g., a profile of a sidewall) of the first area INP_1 in a cross-sectional view may be different from a shape (e.g., a profile of a sidewall) of the second area INP_2 in the cross-section view. A slope of an element herein may refer to an inclination or a gradient of the element.

Specifically, a width W31 of a lower surface of the second area INP_2 may be greater than a width W21 of an upper surface of the first area INP_1. The width W31 may be a distance between adjacent second contacts CNT_2 in the first direction D1 at a vertical level of the lower surface of the second area INP_2. The width W21 may be a distance between adjacent first contacts CNT_1 in the first direction D1 at a vertical level of the upper surface of the first area INP_1. The width W21 of the upper surface of the first area INP_1 may be greater than or substantially equal to a width W11 of the lower surface of the first area INP_1. The width W11 may be a distance between adjacent first contacts CNT_1 in the first direction D1 at a vertical level of the lower surface of the first area INP_1. A width W41 of an upper surface of the second area INP_2 may be smaller than the width W31 of the lower surface of the second area INP_2. The width W41 may be a distance between adjacent second contacts CT 2 in the first direction D1 at a vertical level of the upper surface of the second area INP_2.

Each of widths W41 and W42 respectively along the first and second directions D1 and D2 of the second area INP_2 may decrease as the second area INP_2 extends away from substrate 100.

The first area INP_1 and the second area INP_2 may include the same material as each other. For example, each of the first area INP_1 and the second area INP_2 may include silicon nitride, silicon carbonitride, and/or silicon oxycarbonitride. However, the present disclosure is not limited thereto. Since the first area INP_1 and the second area INP_2 may be integrally formed from each other and extend along the sidewalls of the fourth and fifth trenches TR4 and TR5, respectively, no interface (e.g., no visible interface) may exist between the first area INP_1 and the second area INP_2. For example, the first area INP_1 and the second area INP_2 may comprise a unitary structure. The unitary structure (e.g., a monolithic structure or a continuum) herein may refer to a structure formed a same process or a same series of processes without a visible boundary between two or more sub-elements thereof.

A slope of a sidewall of the first contact CNT_1 and a slope of a sidewall of the second contact CNT_2 may be different from each other.

Specifically, a width (e.g., a width in the first direction D1 and/or the second direction D2) of the second contact CNT_2 may increase as the second contact CNT_2 extends away from the substrate 100. Accordingly, a width WC1 of a lower surface of the second contact CNT_2 may be smaller than a width of an upper surface WC2 of the second contact CNT_2.

Hereinafter, a method for manufacturing a semiconductor memory device according to some embodiments will be described using FIG. 4 to FIG. 25B. For convenience of description, differences from those as described above with reference to FIG. 1 to FIG. 3 will be described.

FIG. 4, FIG. 6, FIG. 8, FIG. 10, FIG. 12, FIG. 14, FIG. 16, FIG. 18, FIG. 20, FIG. 22 and FIG. 24 are plan views for illustrating a method for manufacturing a semiconductor memory device according to some embodiments. FIG. 5A, FIG. 7A, FIG. 9A, FIG. 11A, FIG. 13A, FIG. 15A, FIG. 17A, FIG. 19A, FIG. 21A, FIG. 23A, and FIG. 25A are cross-sectional views taken along lines A-A' of FIG. 4, FIG. 6, FIG. 8, FIG. 10, FIG. 12, FIG. 14, FIG. 16, FIG. 18, FIG. 20, FIG. 22, and FIG. 24, respectively. FIG. 5B, FIG. 7B, FIG. 9B, FIG. 11B, FIG. 13B, FIG. 15B, FIG. 17B, FIG. 19B, FIG. 21B, FIG. 23B, and FIG. 25B are cross-sectional views taken along lines B-B' of FIG. 4, FIG. 6, FIG. 8, FIG. 10, FIG. 12, FIG. 14, FIG. 16, FIG. 18, FIG. 20, FIG. 22, and FIG. 24, respectively.

Figure 4:
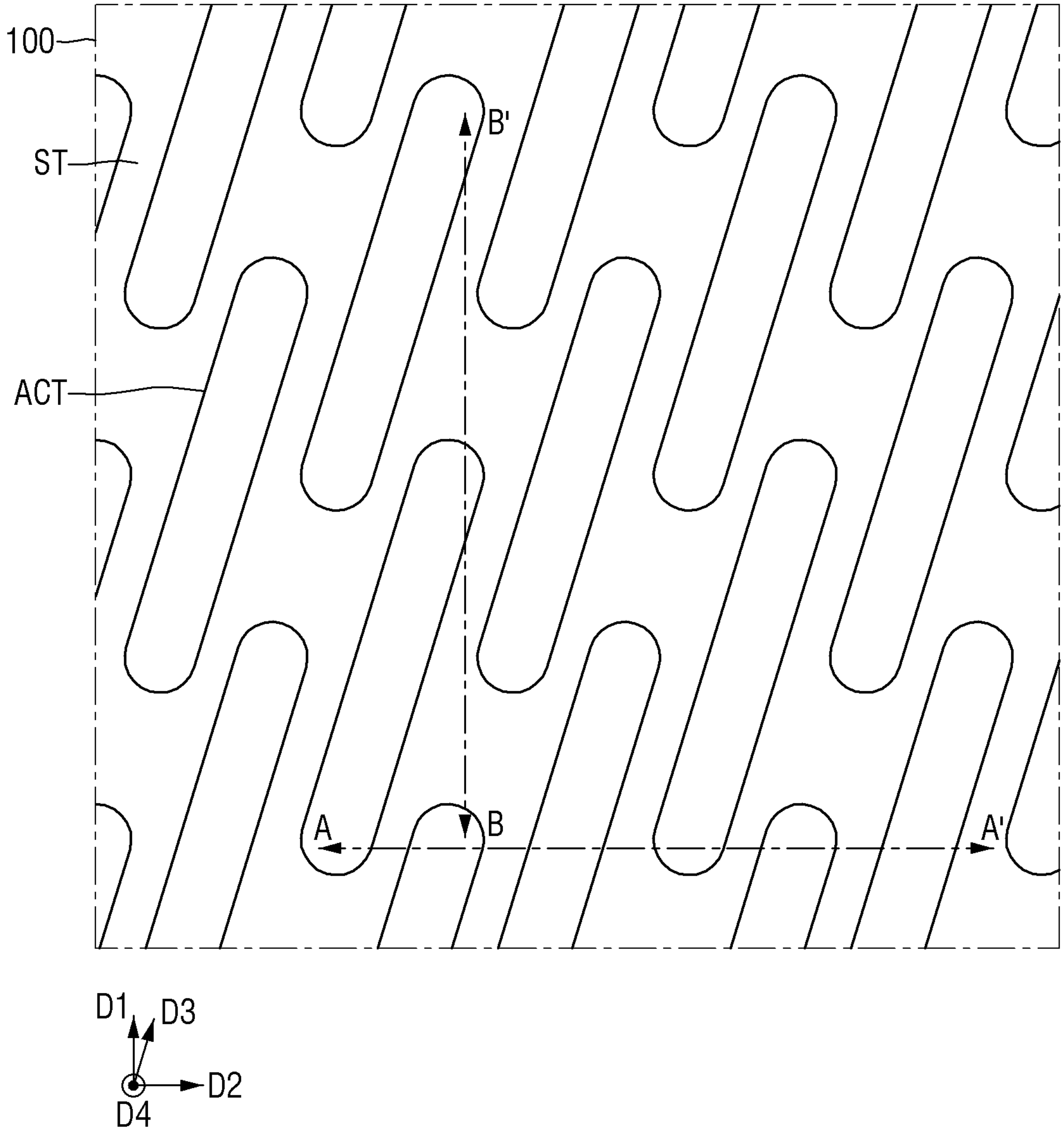
FIG. 4, FIG. 6, FIG. 8, FIG. 10, FIG. 12, FIG. 14, FIG. 16, FIG. 18, FIG. 20, FIG. 22 and FIG. 24 are plan views for illustrating a method for manufacturing a semiconductor memory device according to some embodiments.
Figure 5A:
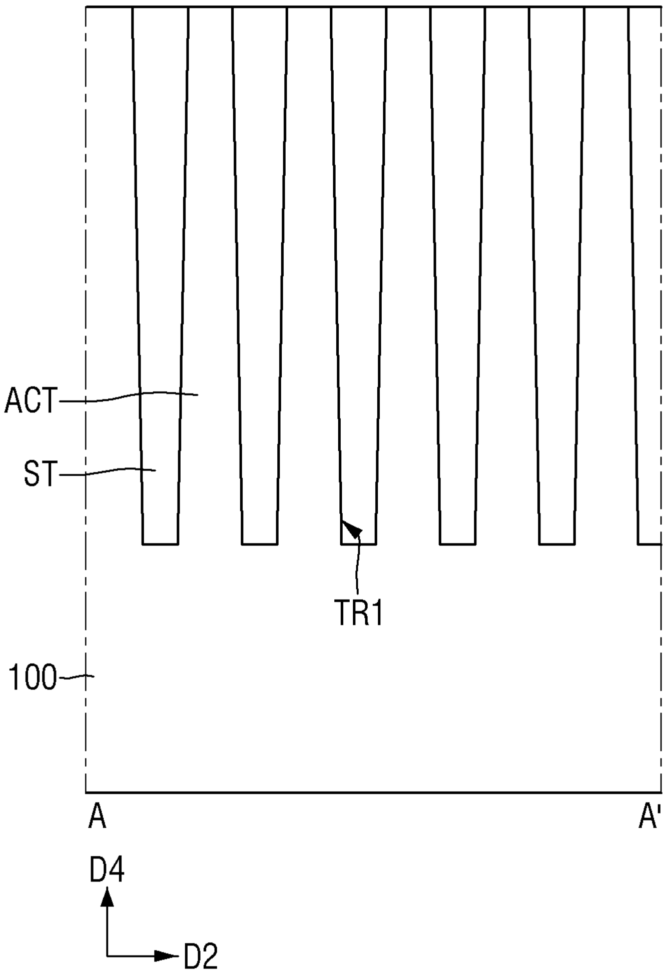
FIG. 5A, FIG. 7A, FIG. 9A, FIG. 11A, FIG. 13A, FIG. 15A, FIG. 17A, FIG. 19A, FIG. 21A, FIG. 23A, and FIG. 25A are cross-sectional views taken along lines A-A' of FIG. 4, FIG. 6, FIG. 8, FIG. 10, FIG. 12, FIG. 14, FIG. 16, FIG. 18, FIG. 20, FIG. 22, and FIG. 24, respectively.
Figure 5B:
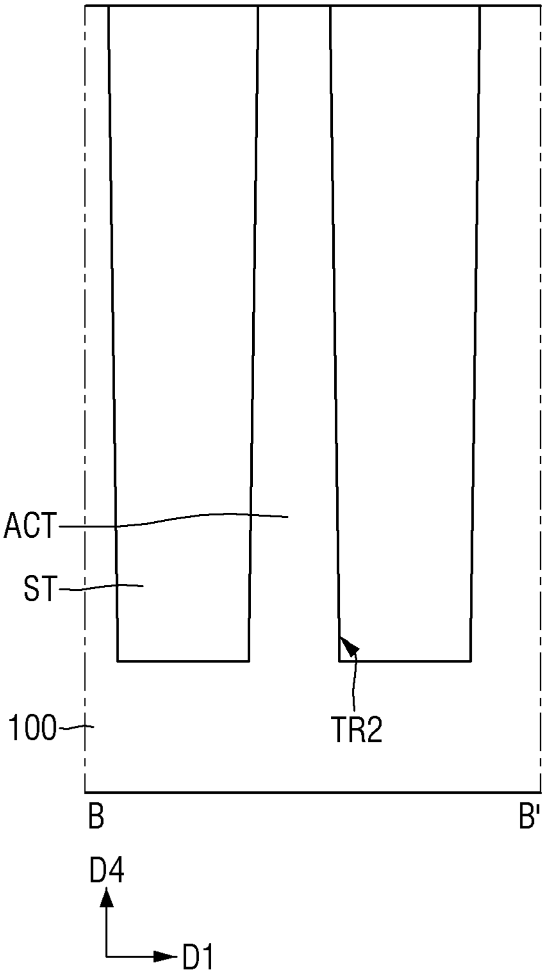
FIG. 5B, FIG. 7B, FIG. 9B, FIG. 11B, FIG. 13B, FIG. 15B, FIG. 17B, FIG. 19B, FIG. 21B, FIG. 23B, and FIG. 25B are cross-sectional views taken along lines B-B' of FIG. 4, FIG. 6, FIG. 8, FIG. 10, FIG. 12, FIG. 14, FIG. 16, FIG. 18, FIG. 20, FIG. 22, and FIG. 24, respectively.

Referring to FIG. 4, FIG. 5A, and FIG. 5B, the active patterns ACT may be formed by patterning the upper portion of the substrate 100. Each of the active patterns ACT may extend in the third direction D3 and in a parallel manner to the upper surface of the substrate 100. The active patterns ACT may be two-dimensionally arranged along the first direction D1 and the second direction D2. The active patterns ACT may be spaced apart from each other in the third direction D3.

Between the active patterns ACT, the first and second trenches TR1 and TR2 may be defined. The element isolation film ST filling (e.g., at least partially filling) the first and second trenches TR1 and TR2 may be formed. The element isolation film ST may be formed to cover the active patterns ACT while entirely filling the first and second trenches TR1 and TR2. A planarization process may be performed on the element isolation film ST until the upper surfaces of the active patterns ACT are exposed.

Figure 6:
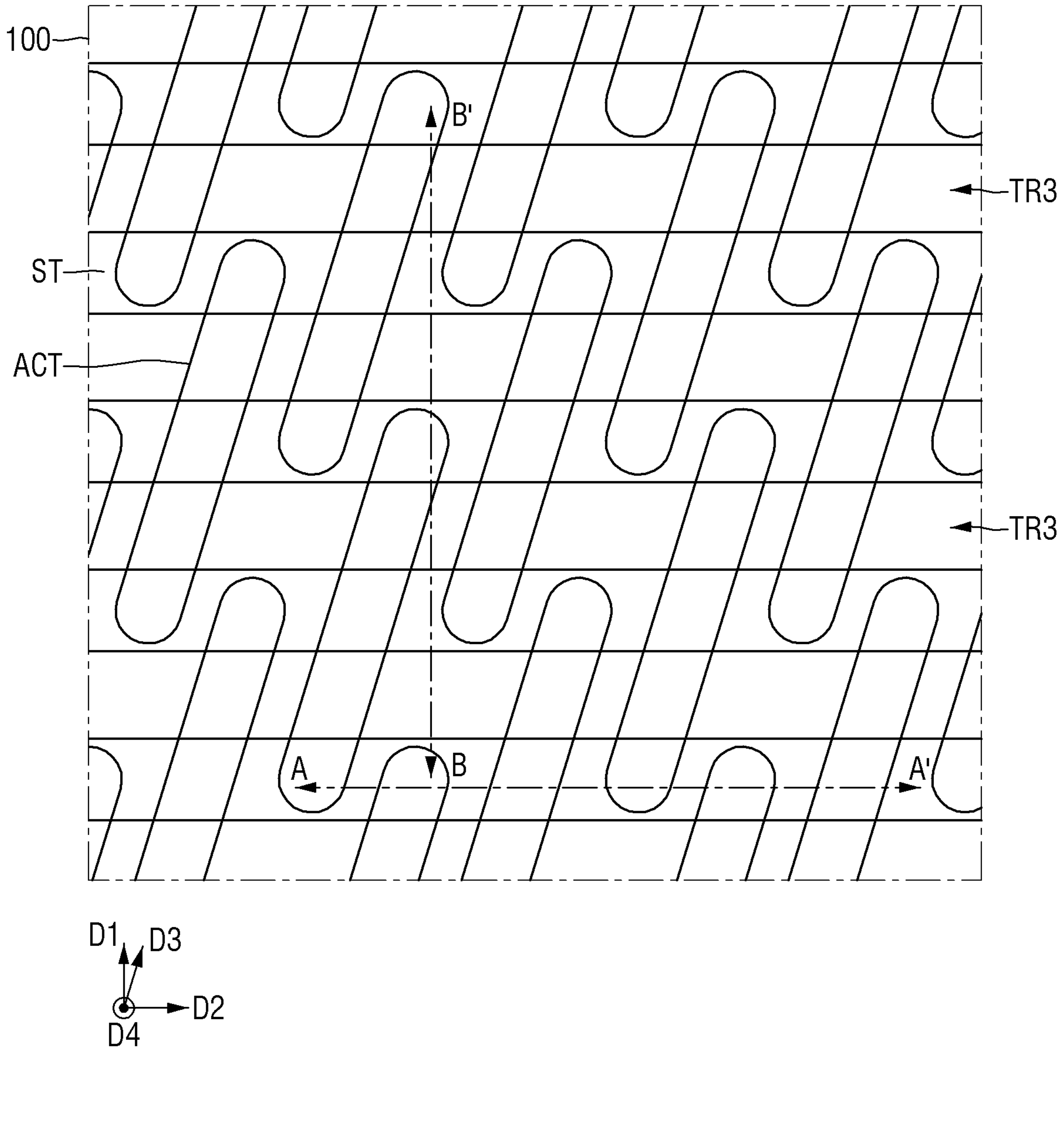
Figure 7A:
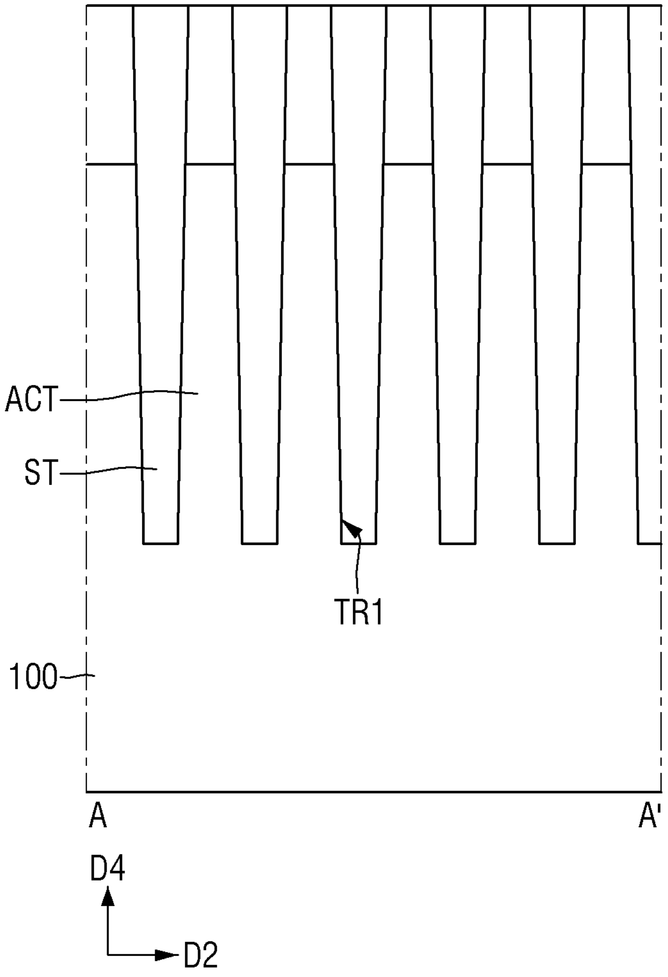
Figure 7B:
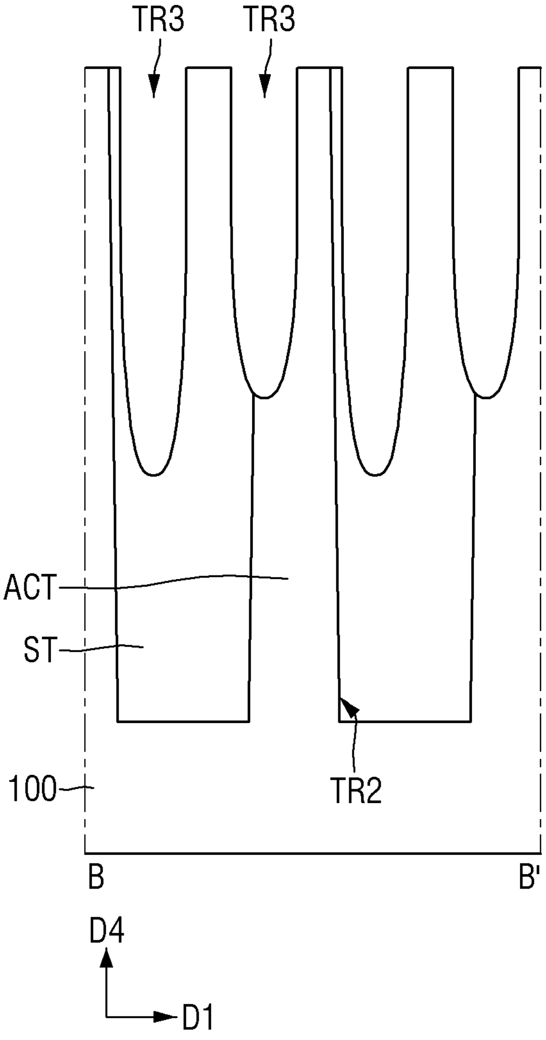

Referring to FIG. 6, FIG. 7A, and FIG. 7B, the third trenches TR3 may be formed by patterning the active patterns ACT and the element isolation film ST. In a plan view, each of the third trenches TR3 may have a line shape extending in the second direction D2.

Forming the third trenches TR3 may include forming a hard mask pattern having openings defined therein, and etching the exposed active patterns ACT and the exposed element isolation film ST using the hard mask pattern as an etch mask. The third trench TR3 may be formed so as to be shallower than the first trench TR1. For example, a lower surface of the first trench TR1 may be lower than a lower surface of the third trench TR3.

Figure 8:
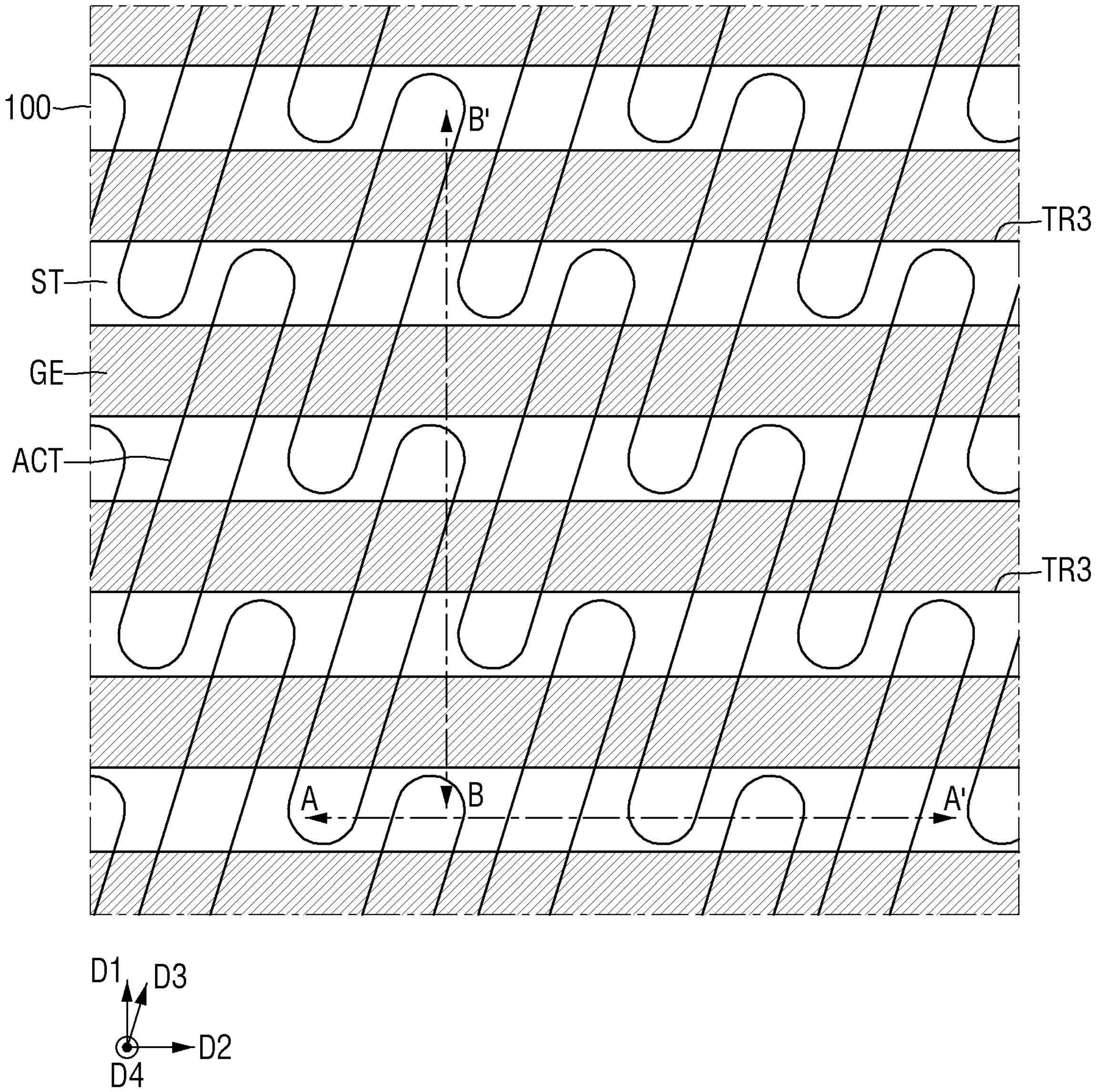
Figure 9A:
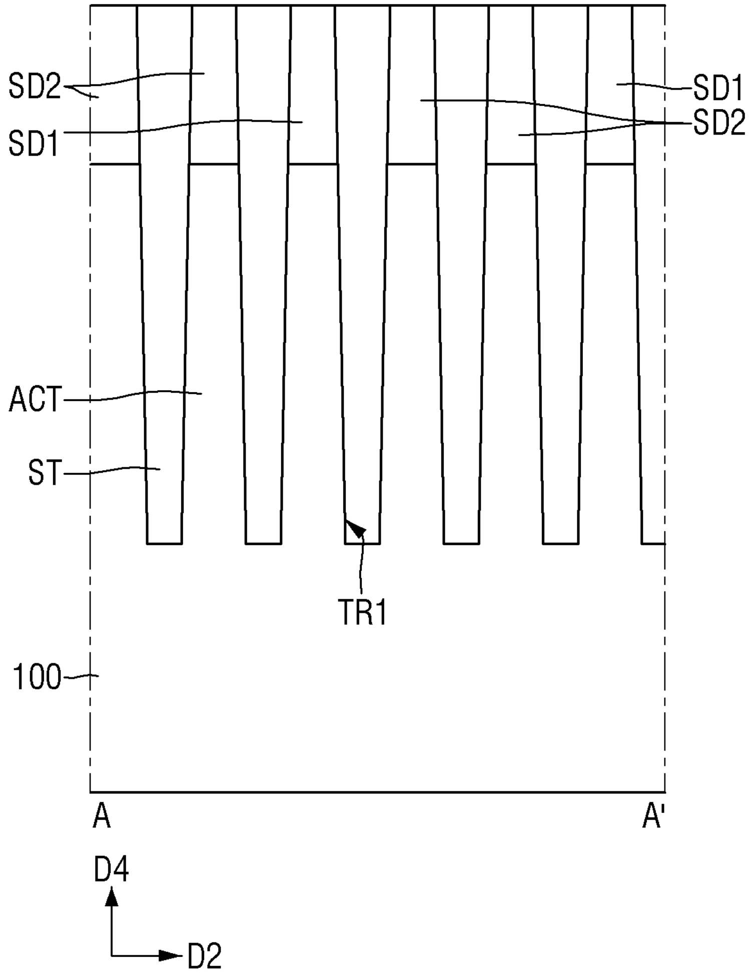
Figure 9B:
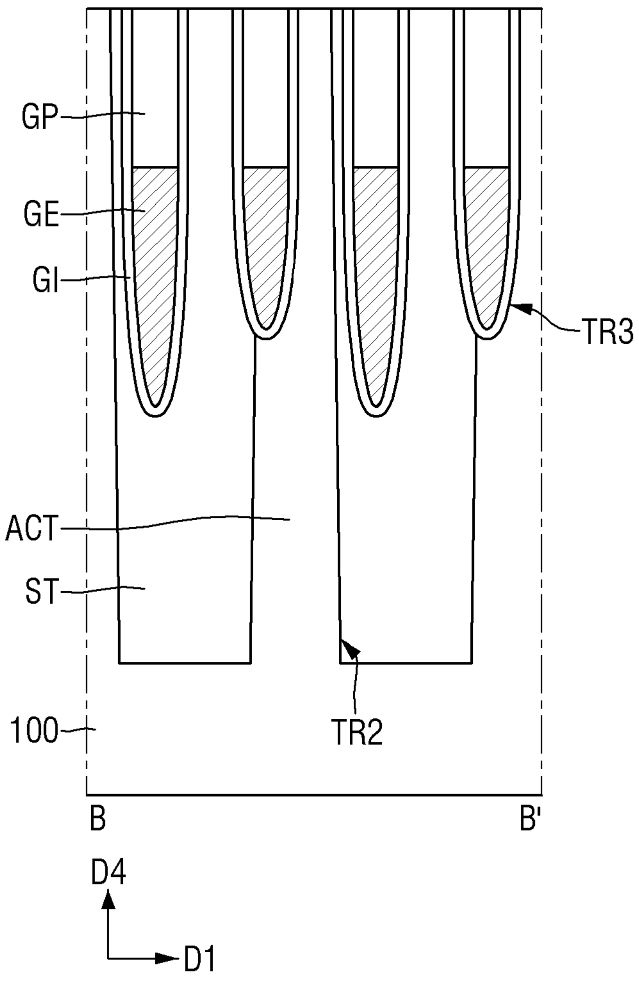

Referring to FIG. 8, FIG. 9A, and FIG. 9B, the gate dielectric film GI, the gate electrode GE, and the gate capping film GP may be sequentially formed in each of the third trenches TR3. Specifically, the gate dielectric film GI may be conformally formed in the third trench TR3. For example, the gate dielectric film GI may be conformally formed on an inner surface of the third trench TR3. The gate dielectric film GI may include, for example, a silicon oxide film, a silicon nitride film, a silicon oxynitride film, and/or a film made of a high dielectric constant material.

The gate electrode GE may be formed by forming a conductive film filling (e.g., at least partially filling) the third trench TR3 on the gate dielectric film GI. The conductive film may include, for example, conductive metal nitride and/or metal material.

The gate dielectric film GI and the gate electrode GE may be recessed, and the gate capping film GP may be formed on the recessed gate electrode GE. The upper surface of the gate capping film GP may be coplanar with the upper surface of the active pattern ACT.

An ion implantation process may be performed on the active patterns ACT, such that the first source/drain area SD1 and the pair of the second source/drain areas SD2 may be formed in the upper portion of the active pattern ACT. The pair of the second source/drain areas SD2 may be spaced apart from each other in the third direction D3 while the first source/drain area SD1 is disposed (e.g., interposed) therebetween. For example, the first and second source/drain areas SD1 and SD2 may be doped with the same impurity.

Although not specifically shown, the channel area may be defined in a portion of the active pattern ACT positioned under the gate electrode GE. In a plan view, the channel area may be disposed (e.g., interposed) between the first source/drain area SD1 and the second source/drain area SD2. The gate electrode GE may be disposed on the upper surface and both opposing sidewalls of the channel area.

Figure 10:
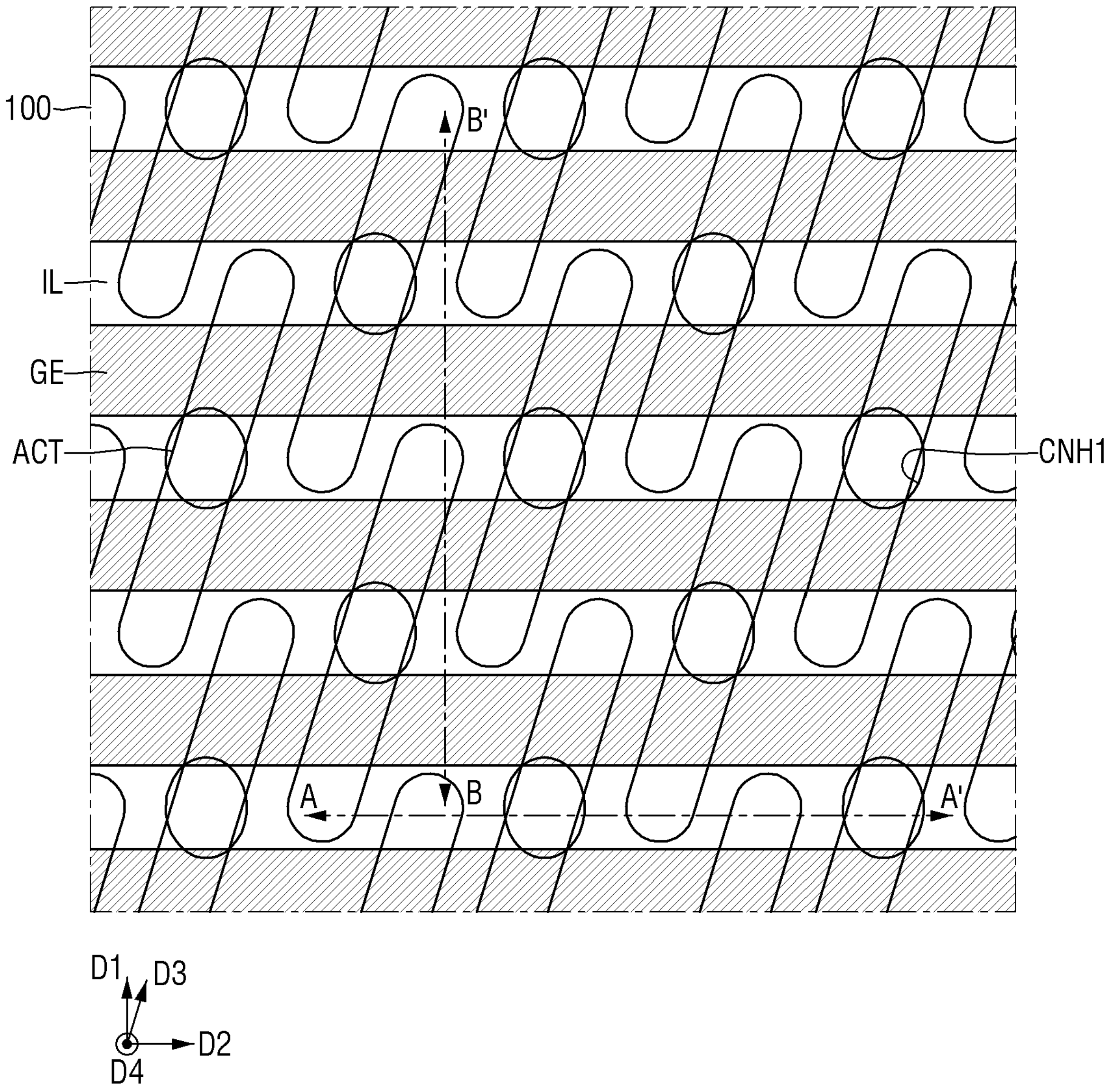
Figure 11A:
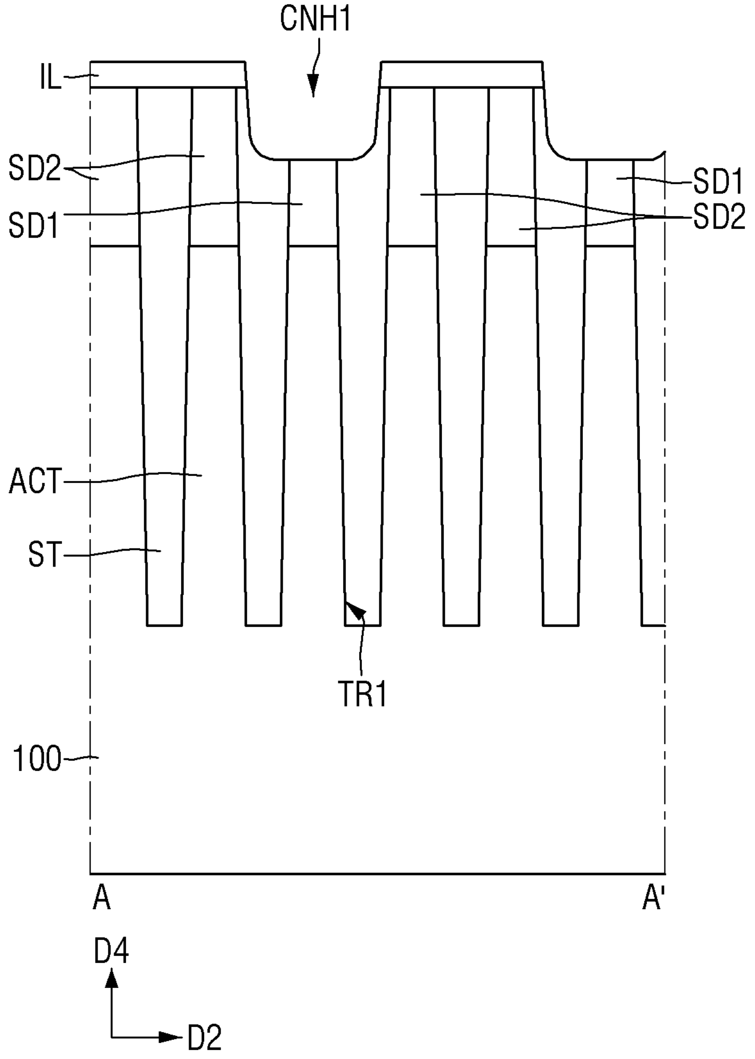
Figure 11B:
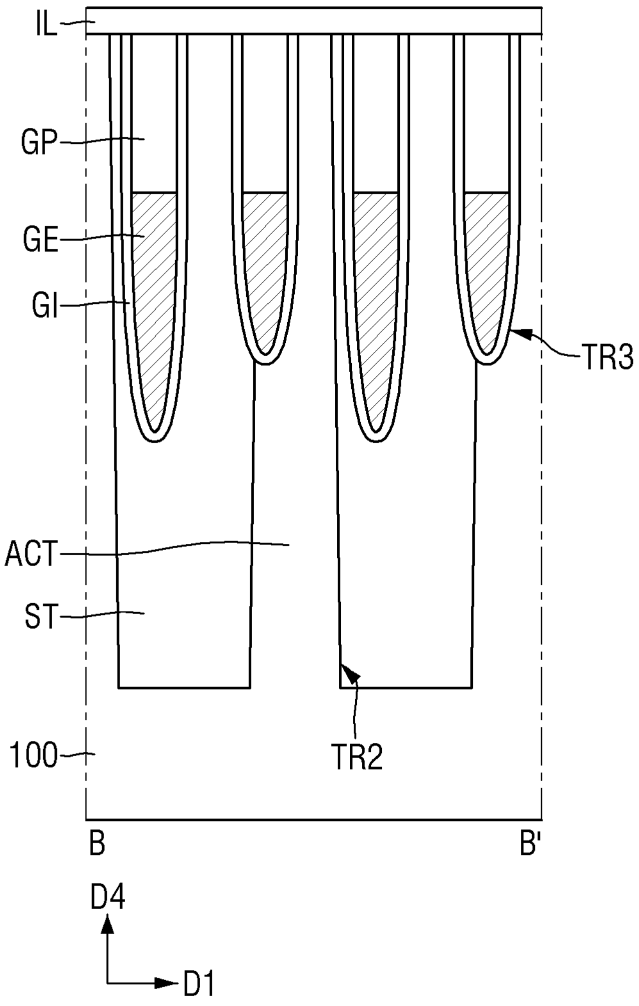

Referring to FIG. 10, FIG. 11A, and FIG. 11B, the insulating film IL may be formed on an entirety of a surface (e.g., an upper surface) of the substrate 100. For example, the insulating film IL may have a multilayer structure in which a silicon oxide layer and a silicon oxynitride layer are stacked. The first contact-holes CNH1 exposing the first source/drain areas SD1 of the active patterns ACT may be formed by patterning the insulating film IL. When the first contact-hole CNH1 is formed, an upper portion of the first source/drain area SD1 may be (e.g., at least partially) recessed. When the first contact-hole CNH1 is formed, an upper portion of an area of the element isolation film ST around the first source/drain area SD1 may be (e.g., at least partially) recessed.

Figure 12:
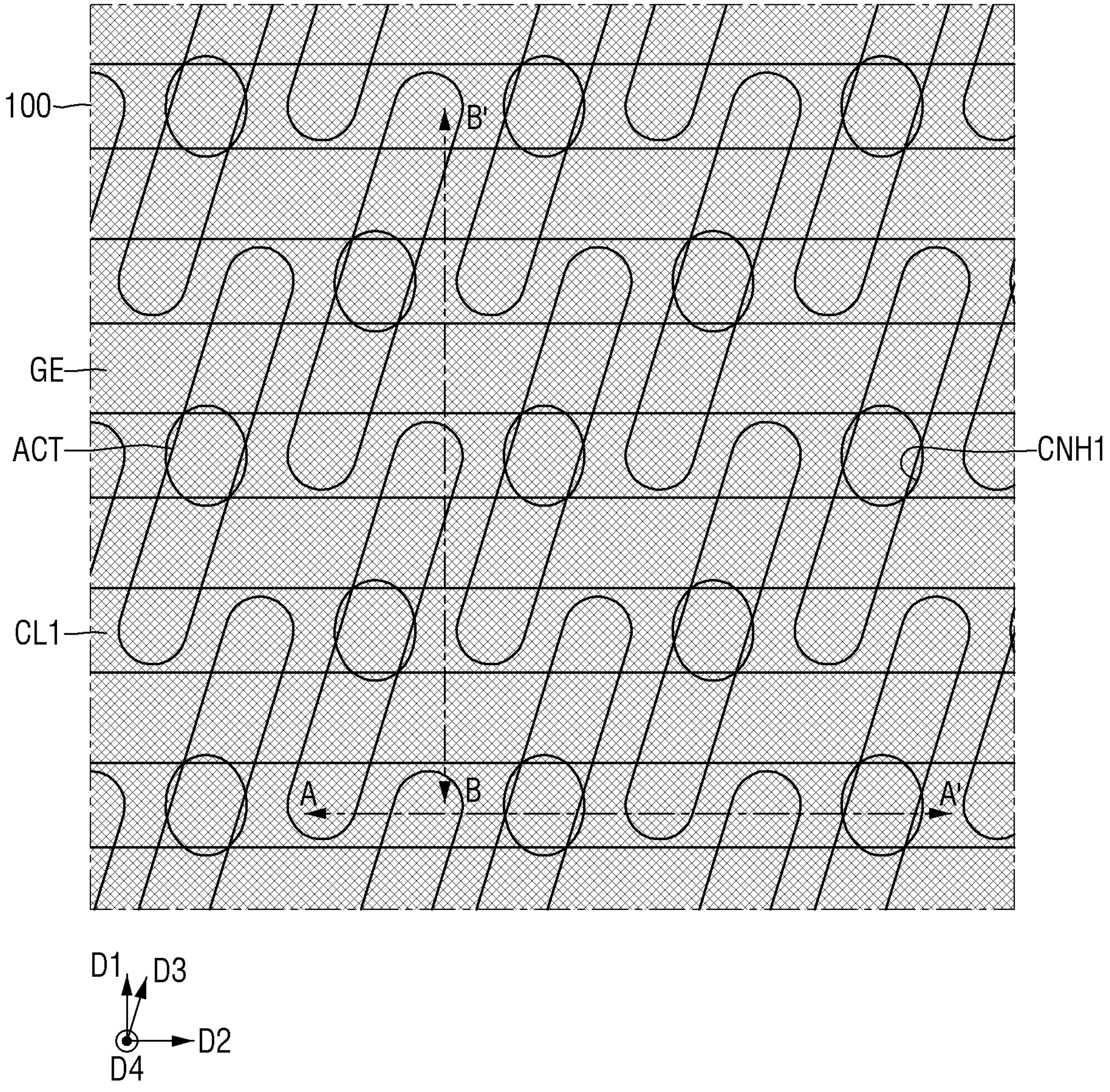
Figure 13A:
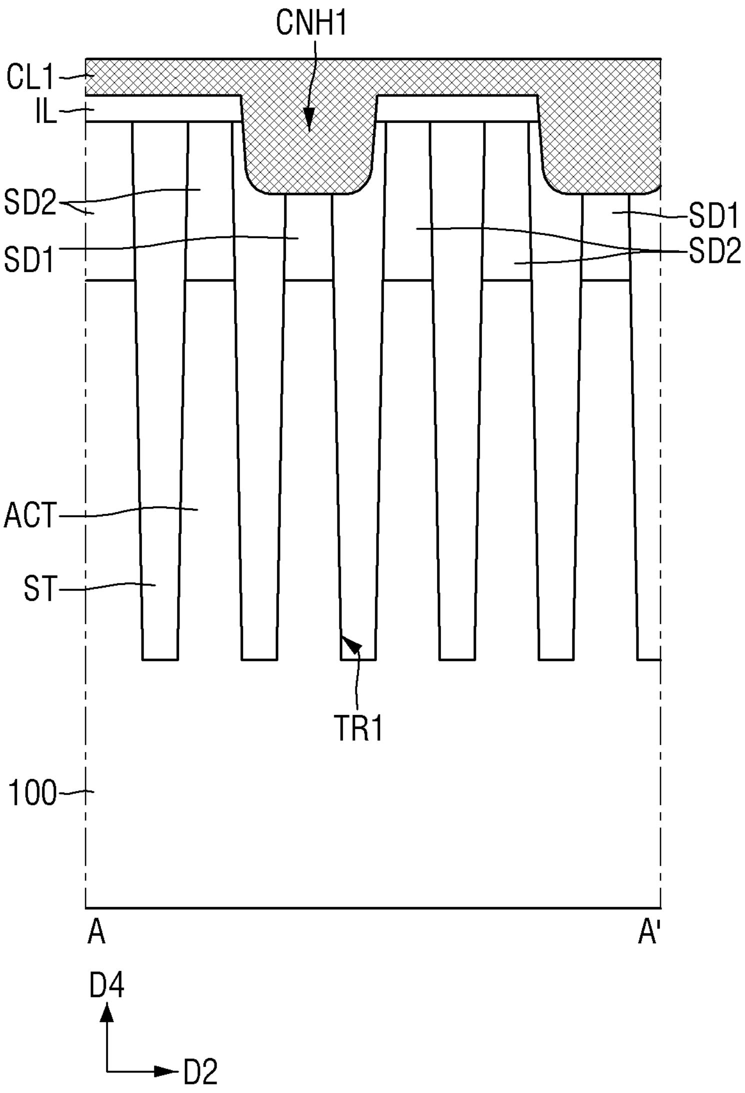
Figure 13B:
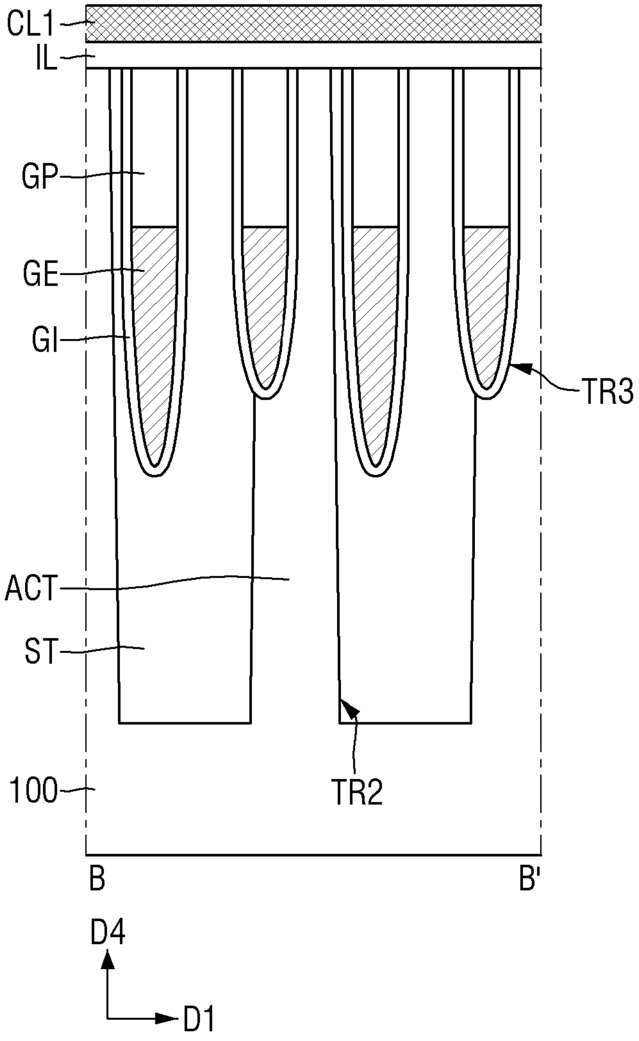

Referring to FIG. 12, FIG. 13A, and FIG. 13B, a first conductive film CL1 may be formed on the insulating film IL. The first conductive film CL1 may fill (e.g., at least partially fill) the first contact-holes CNH1. In other words, the first conductive film CL1 may contact the first source/drain areas SD1 of the active patterns ACT. The first conductive film CL1 may be vertically spaced apart from the second source/drain areas SD2 of the active patterns ACT via the insulating film IL. The first conductive film CL1 may include, for example, a doped semiconductor material.

Figure 14:
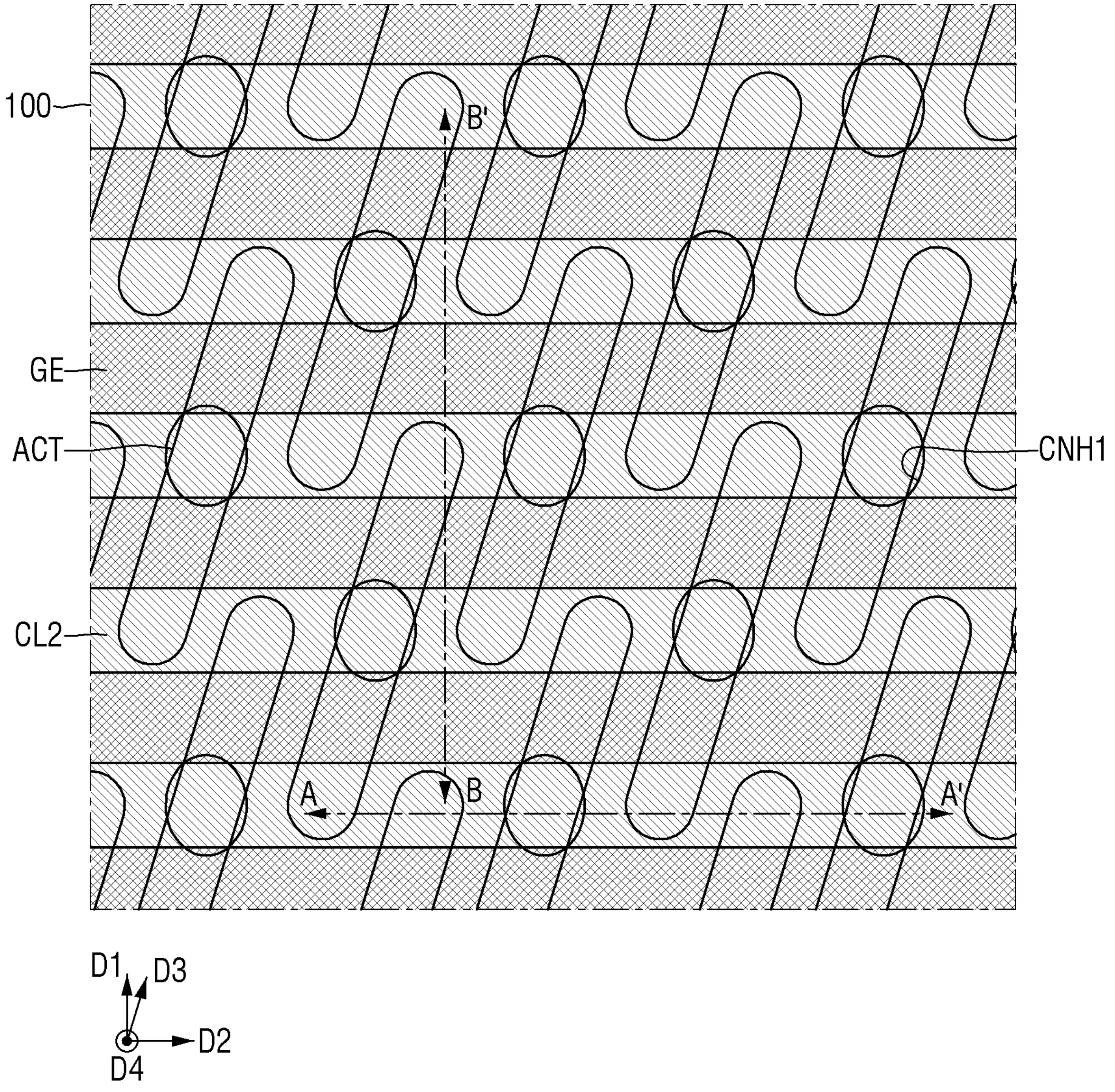
Figure 15A:
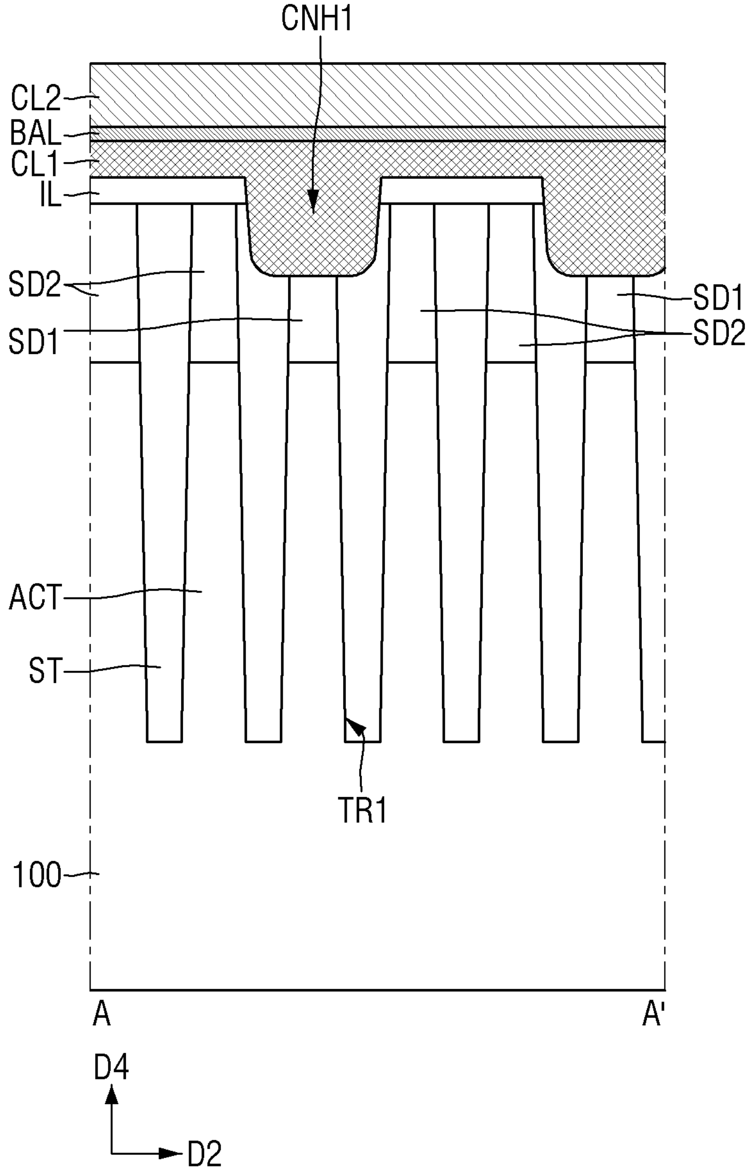
Figure 15B:
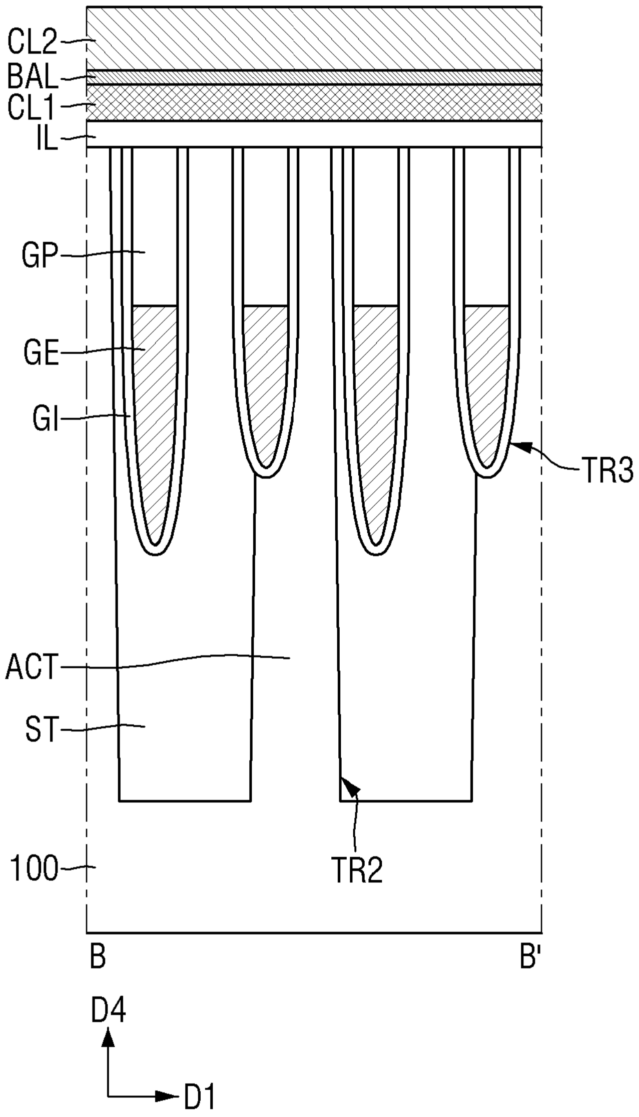

Referring to FIG. 14, FIG. 15A, and FIG. 15B, a barrier film BAL and a second conductive film CL2 may be sequentially formed on the first conductive film CL1. The barrier layer BAL may be formed to be disposed (e.g., interposed) between the first conductive film CL1 and the second conductive film CL2. The barrier film BAL may include, for example, a conductive metal nitride. The second conductive film CL2 may include, for example, a metal material. The barrier film BAL may suppress diffusion of the metal material in the second conductive film CL2 to the first conductive film CL1.

Figure 16:
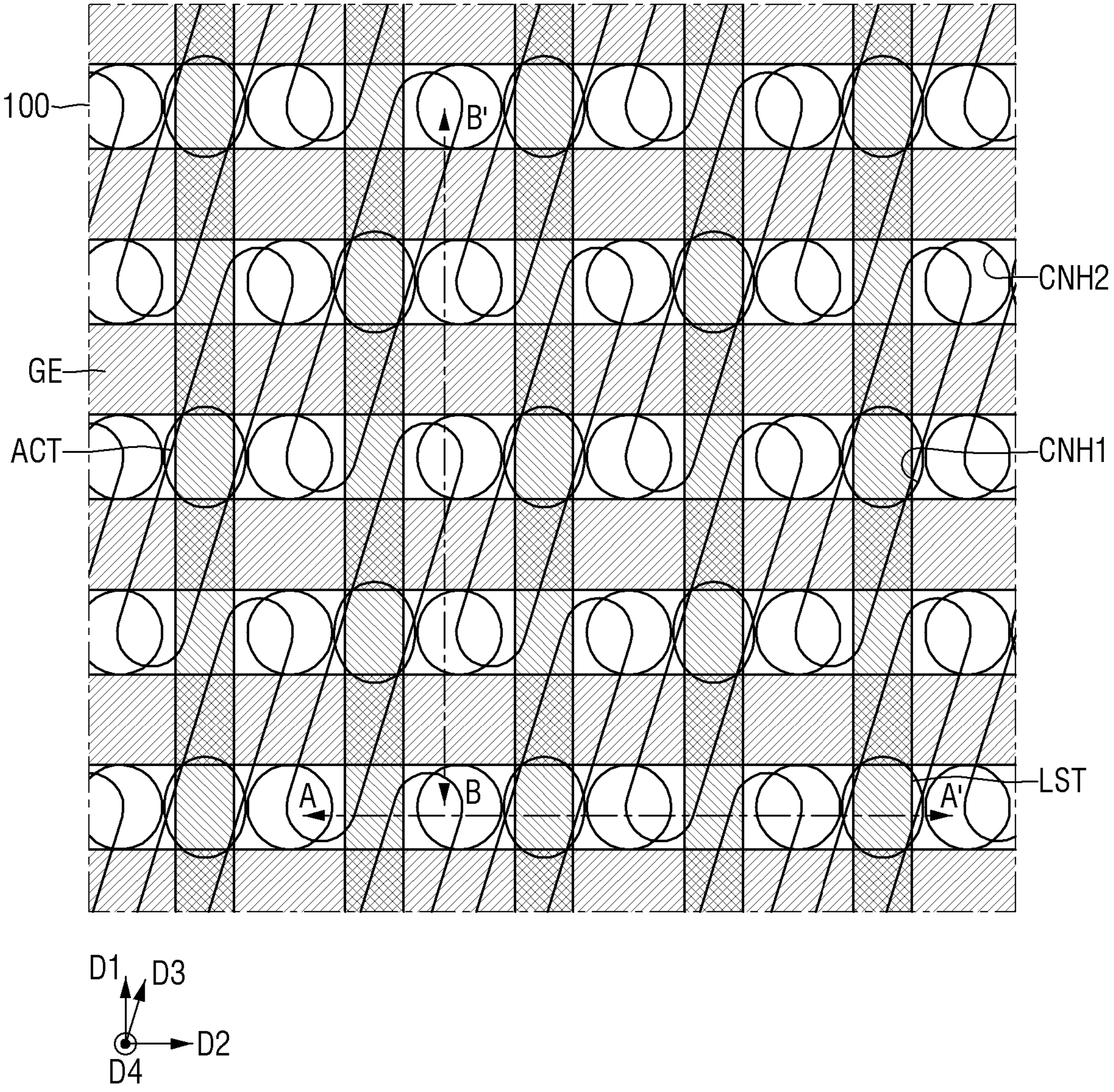
Figure 17B:
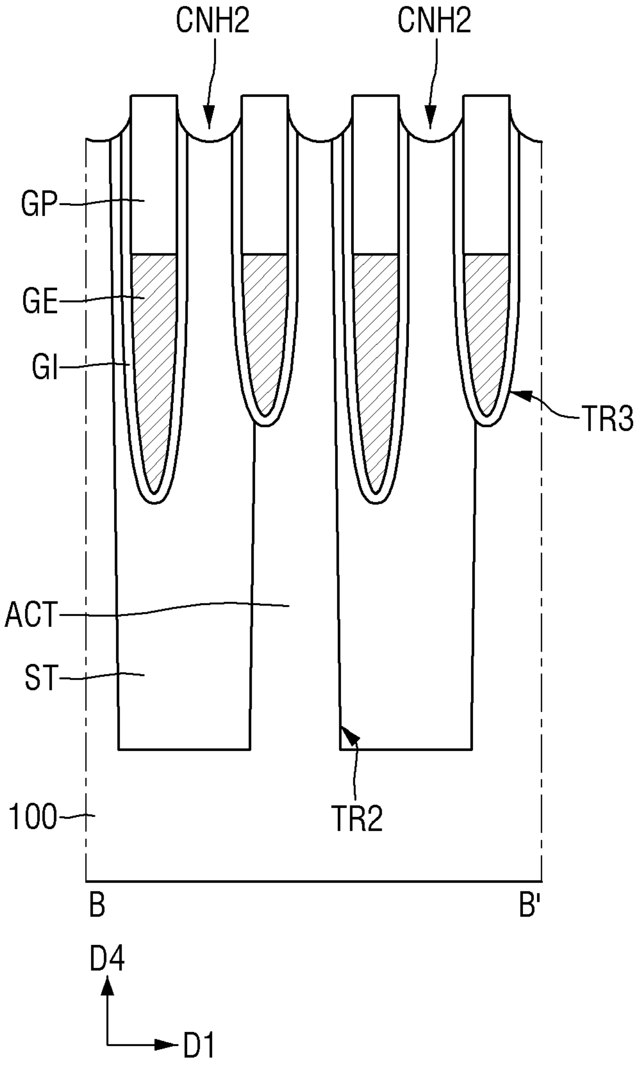

Referring to FIG. 16, FIG. 17A, and FIG. 17B, the bit-line structures LST extending in a parallel manner to each other and in the first direction D1 may be formed on the insulating film IL. The bit-line structures LST may be arranged along the second direction D2. For example, the bit-line structures LST may be spaced apart from each other in the second direction D2.

Specifically, the mask patterns MP may be formed on the second conductive film CL2. Each of the mask patterns MP may be formed to have a line shape extending in the first direction D1. For example, the thickness T1 of the mask pattern MP in the fourth direction D4 may be in a range of 150 Å to 450 Å. However, the present disclosure is not limited thereto. For example, the mask patterns MP may include a silicon nitride film or a silicon oxynitride film.

According to some embodiments, the thickness T1 of the mask pattern MP in the fourth direction D4 may be smaller than that in a conventional case, thereby minimizing warping of the bit-line structure LST due to a large height of the mask pattern MP in the conventional case.

The second conductive film CL2, the barrier film BAL, and the first conductive film CL1 may be sequentially patterned using the mask patterns MP as a mask, such that the bit-line BL, the barrier pattern BP, and the conductive pattern CP may be respectively formed. The mask pattern MP, the bit-line BL, the barrier pattern BP, and the conductive pattern CP may vertically overlap each other (e.g., overlap each other in the fourth direction D4). The mask pattern MP, the bit-line BL, the barrier pattern BP, and the conductive pattern CP may constitute the bit-line structure LST. In a plan view, the bit-lines BL may intersect the gate electrodes GE.

The second contact-holes CNH2 exposing the tops (e.g., the upper surfaces) of the second source/drains area SD2 of the active patterns ACT may be formed.

Figure 18:
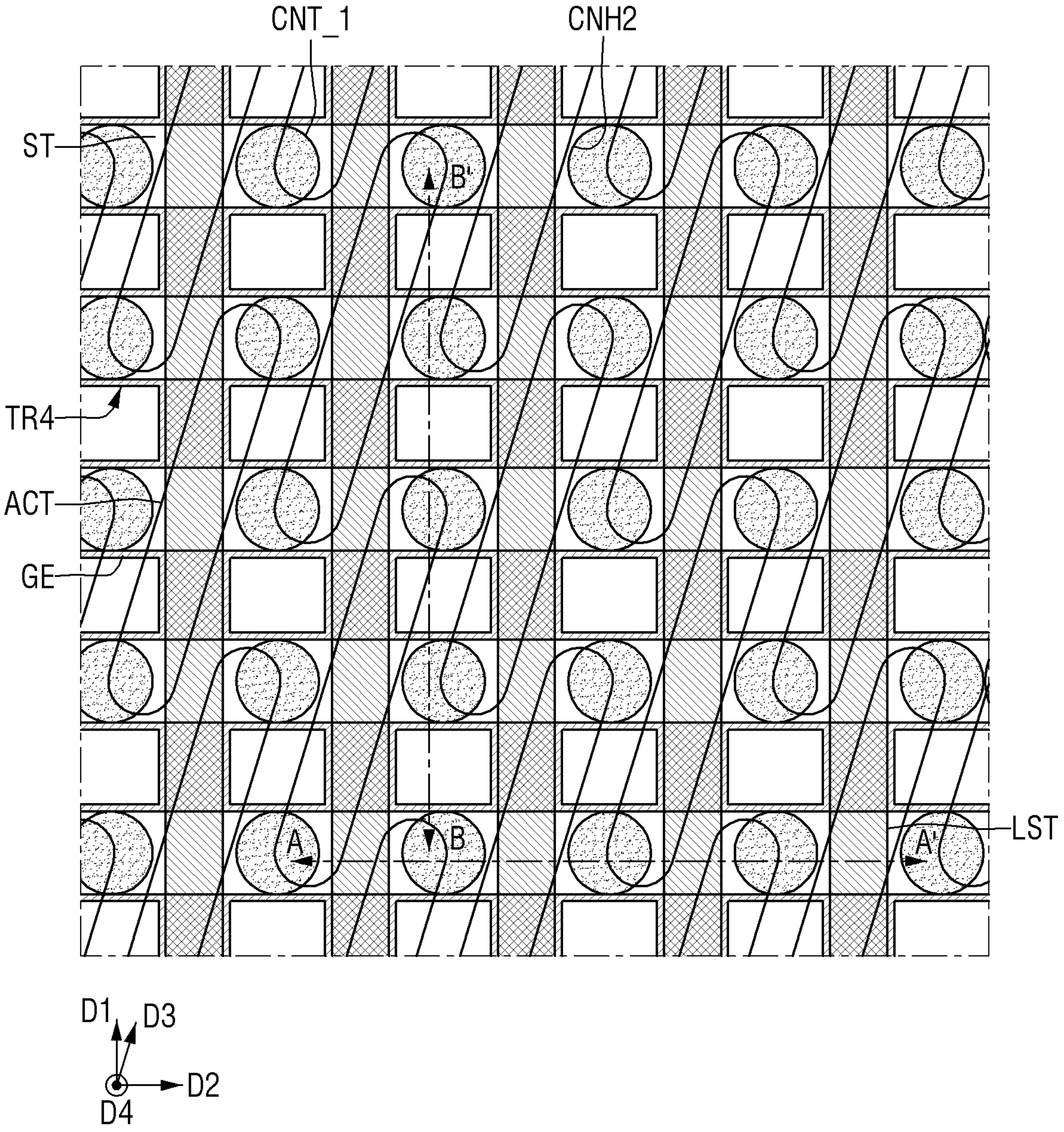
Figure 19A:
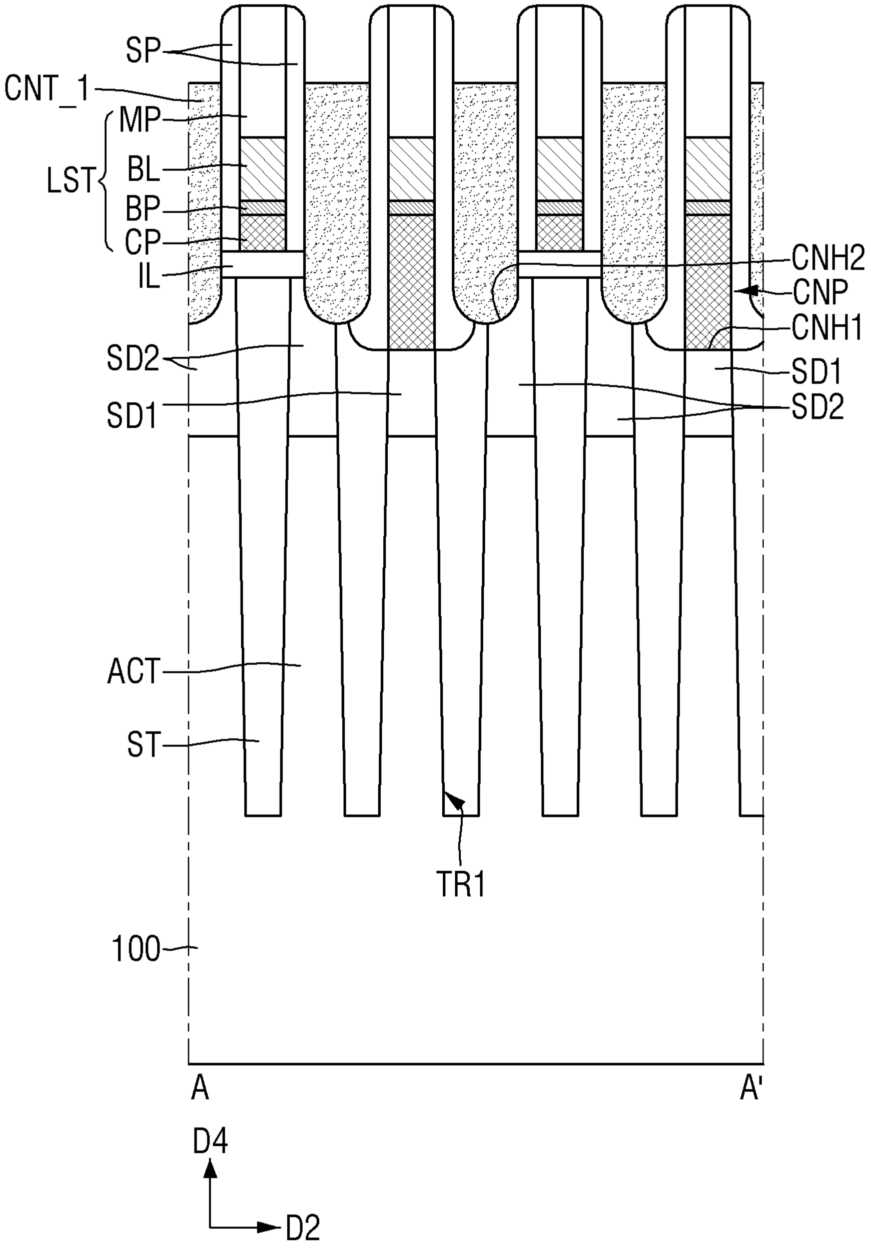
Figure 19B:
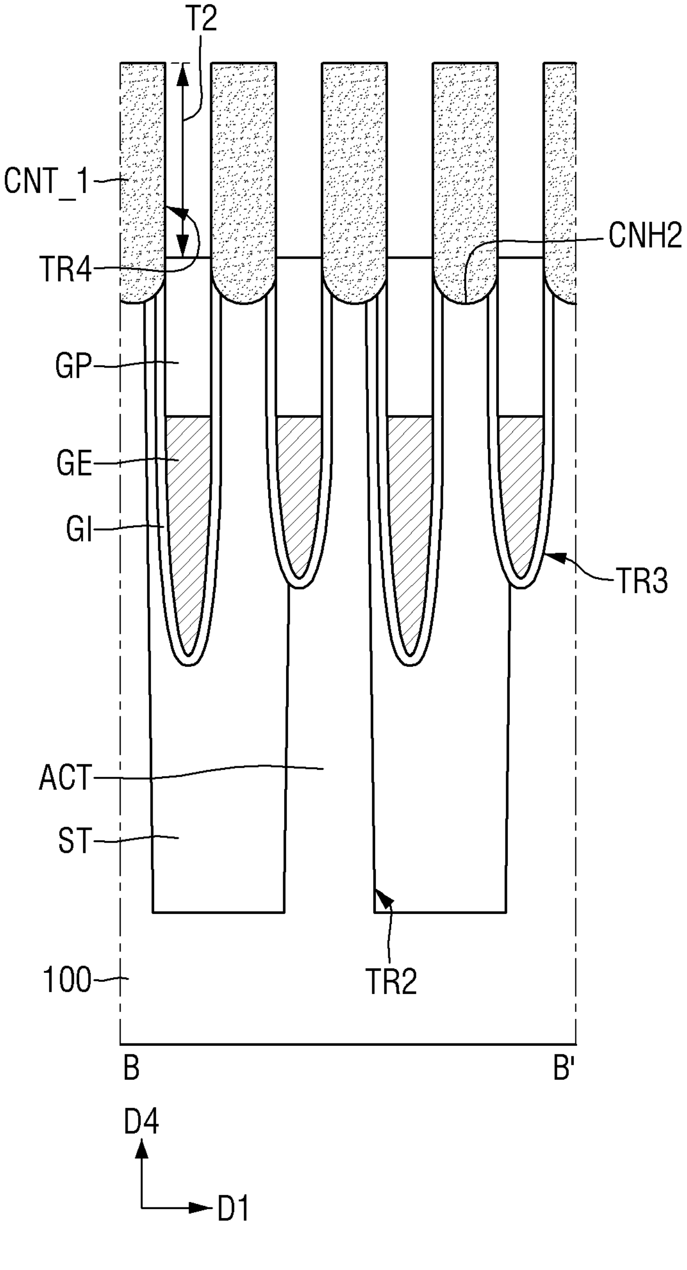

Referring to FIG. 18, FIG. 19A, and FIG. 19B, the first contacts CNT_1 may be respectively formed in the second contact-holes CNH2 by filling (e.g., by at least partially filling) the second contact-holes CNH2 with a conductive material. The first contacts CNT_1 may be electrically connected (e.g., connected) to the second source/drain areas SD2. After forming the conductive material on an entirety of the surface (e.g., the upper surface) of the substrate 100, the conductive material may be recessed.

The conductive material filling (e.g., at least partially filling) the second contact-holes CNH2 may be, for example, polysilicon and/or metal material.

According to some embodiments, the height of the mask pattern MP may be smaller than that in a conventional case, such that the first contact CNT_1 may be formed more reliably.

The first contacts CNT_1 may be etched to form the fourth trench TR4 exposing the sidewalls of the first contacts CNT_1 and the upper surface of the gate capping film GP. For example, a depth T2 of the fourth trench TR4 in the fourth direction D4 may be smaller than 300 Å. However, the present disclosure is not limited thereto.

According to some embodiments, as the height of the mask pattern MP is smaller than that in the conventional case, the depth of the fourth trench TR4 may be smaller than that in the conventional case. Accordingly, a cost and difficulty of a process for etching the first contact CNT_1 may be reduced.

Figure 20:
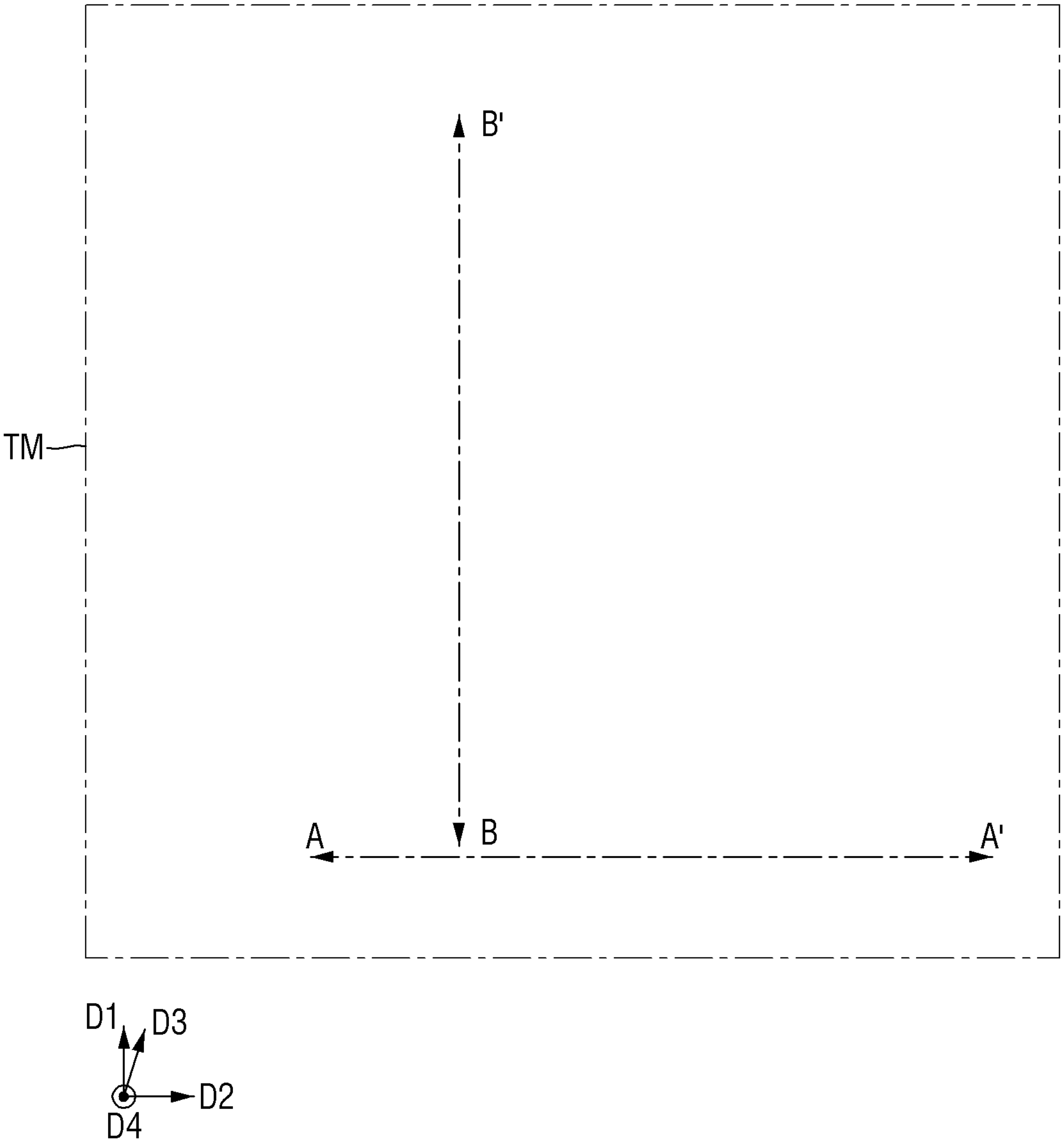
Figure 21A:
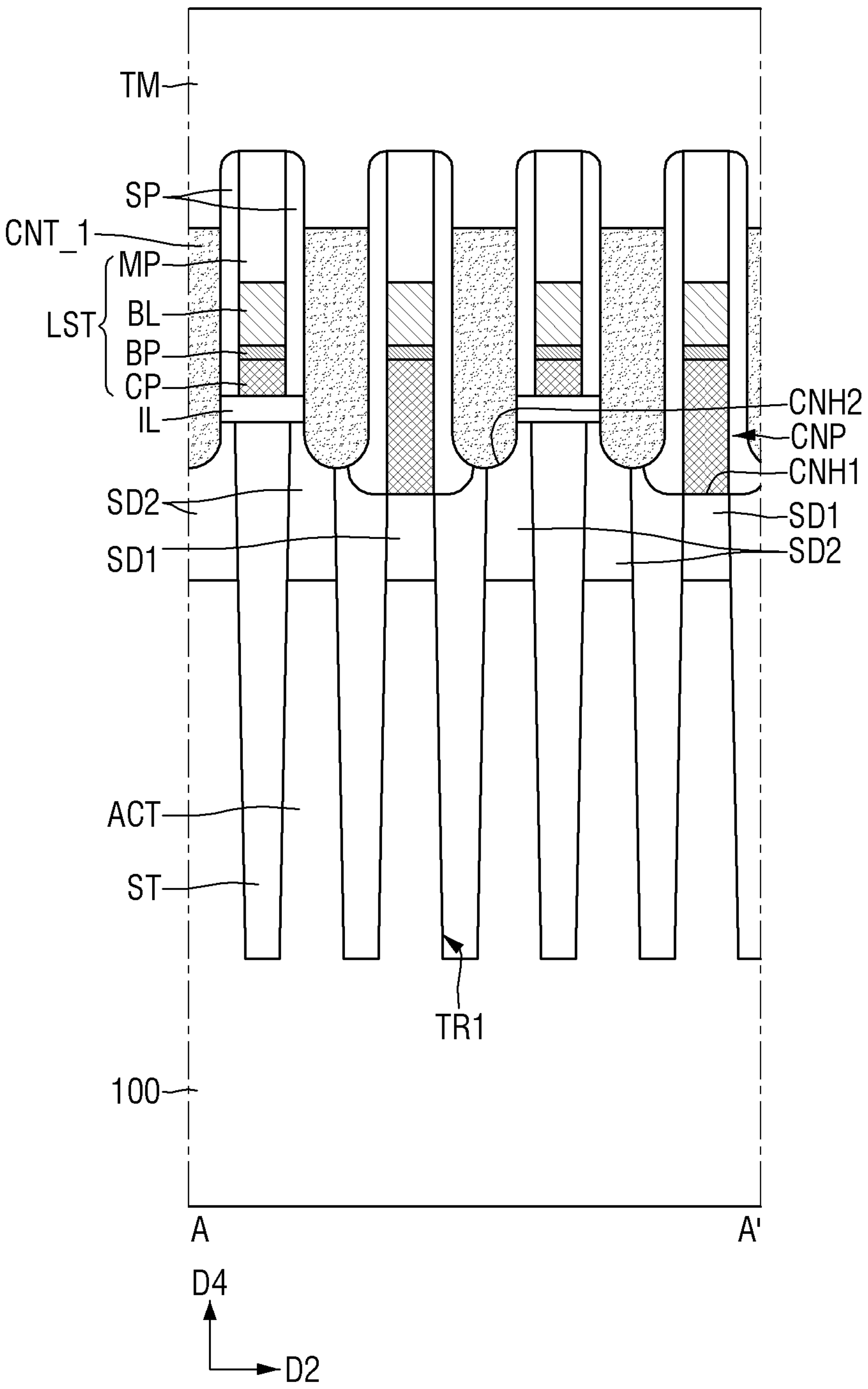
Figure 21B:
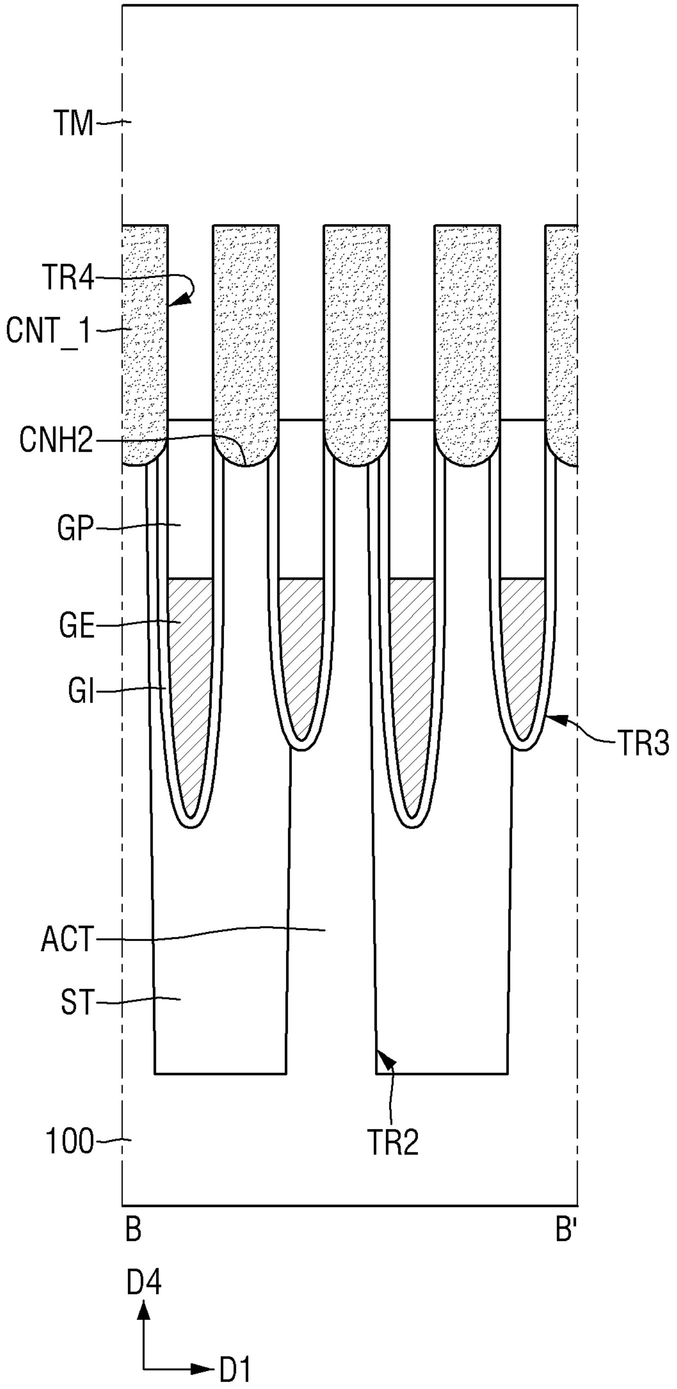

Referring to FIG. 20, FIG. 21A, and FIG. 21B, a mold layer TM that partially or completely fills the fourth trench TR4 and covers or overlap (e.g., overlap in the fourth direction D4) the upper surfaces of the first contacts CNT_1 may be formed.

Referring to FIG. 21A, the mold layer TM may cover or overlap (e.g., overlap in the fourth direction D4) the upper surface of the bit-line structure LST and thus, may contact an entirety of the upper surface of the bit-line structure LST. In addition, the mold layer TM may cover or overlap (e.g., overlap in the fourth direction D4) a portion of a side surface of the bit-line structure LST so as to contact the portion of the side surface of the bit-line structure LST. However, the present disclosure is not limited thereto.

Referring to FIG. 21B, the mold layer TM may be on (e.g., contact) a sidewall and the upper surface of each of the first contacts CNT_1 and the upper surface of the gate capping film GP. For example, the mold layer TM may include silicon nitride. However, the present disclosure is not limited thereto.

Figure 22:
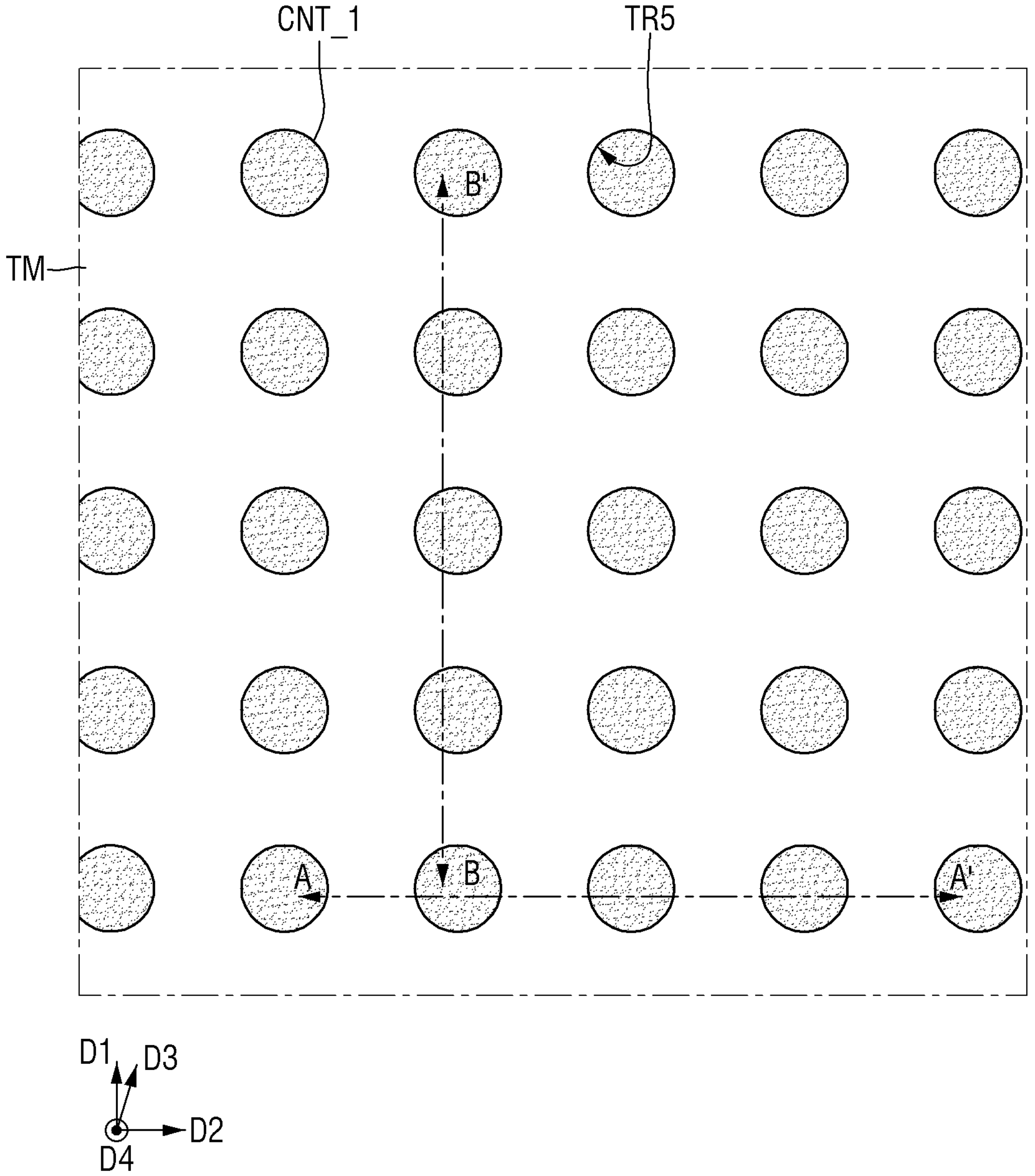
Figure 23A:
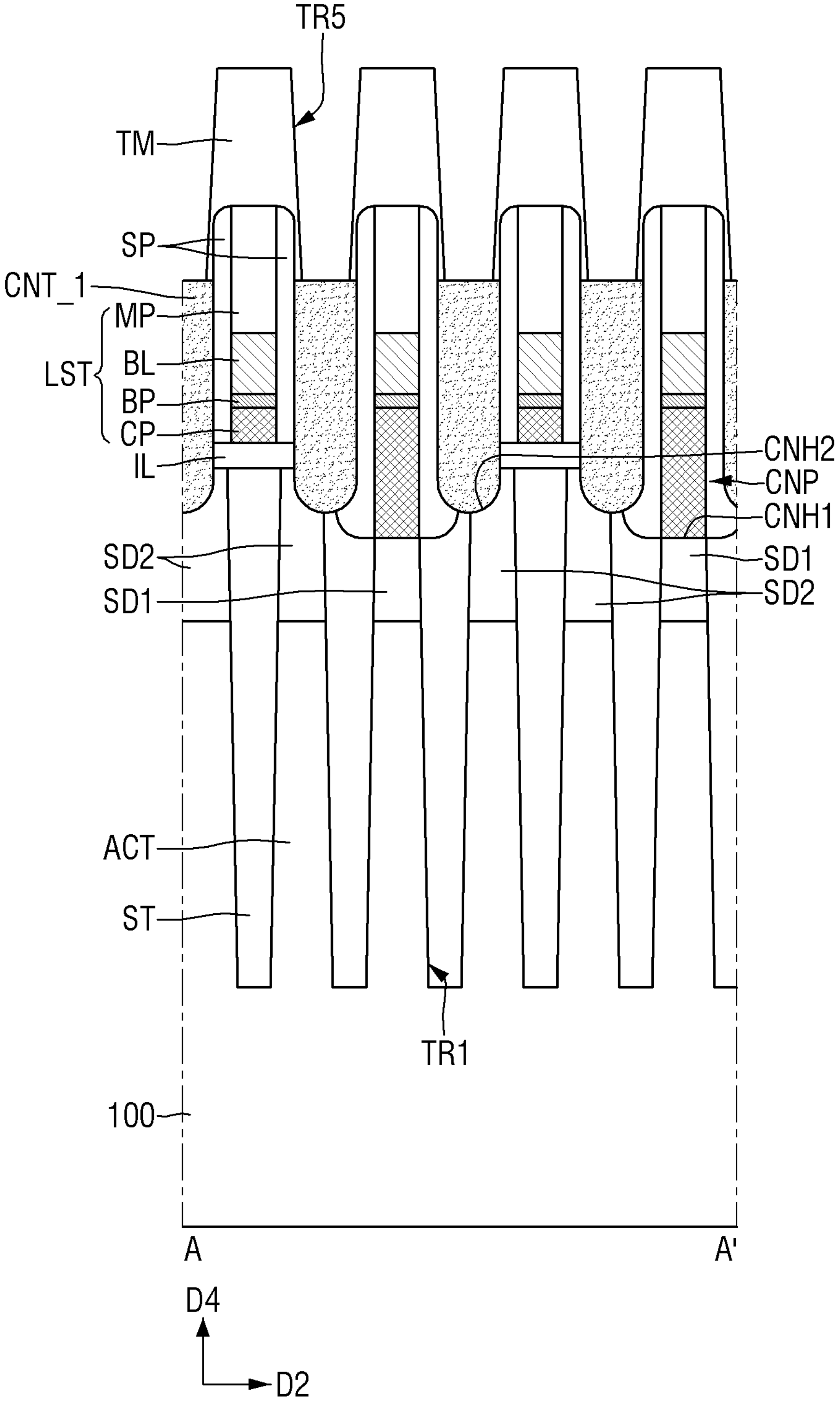
Figure 23B:
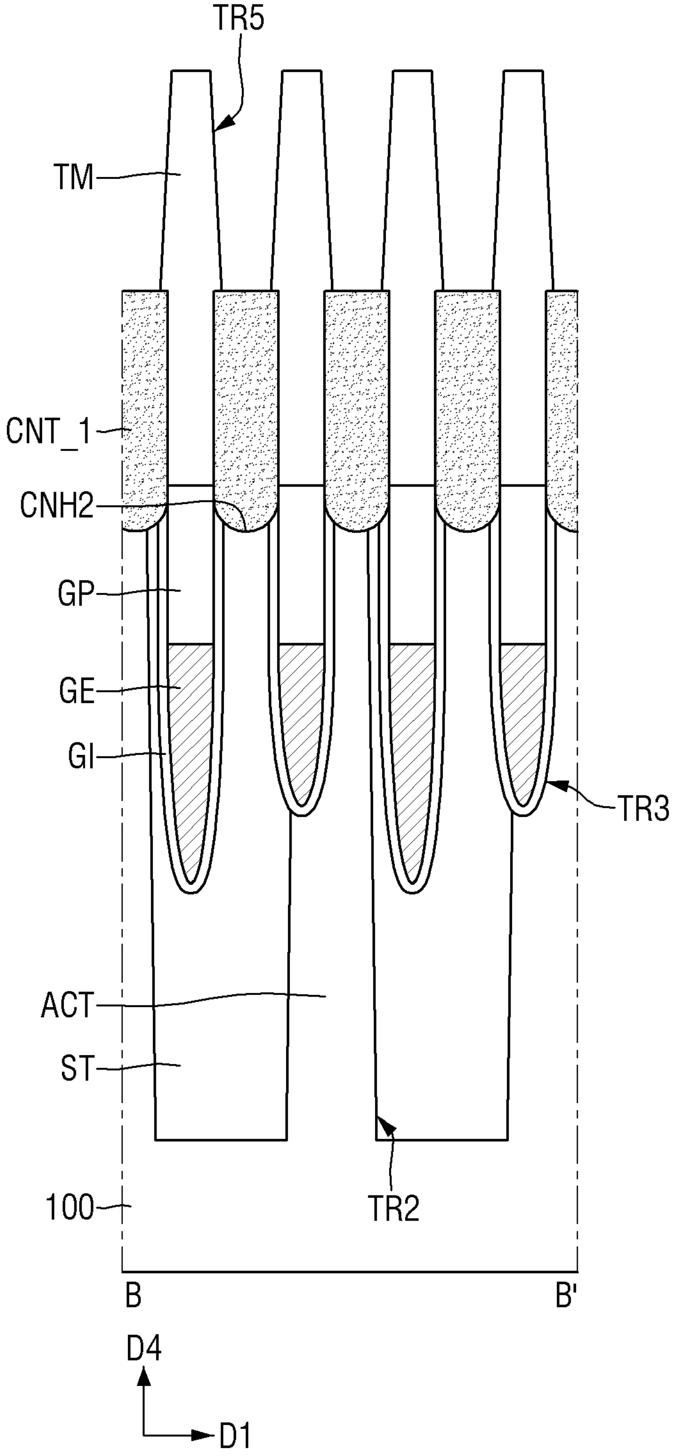

Referring to FIG. 22, FIG. 23A, and FIG. 23B, the mold layer TM may be etched to form the fifth trench TR5 exposing a sidewall of the mold layer TM and the upper surface of each of the first contacts CNT_1. For example, the fifth trench TR5 may have an inverted trapezoidal shape in a cross-sectional view. Accordingly, the etched mold layer TM may have a trapezoidal shape, and each of the second contacts CNT_2 to be described later may have an inverted trapezoidal shape in a cross-sectional view. However, the present disclosure is not limited thereto.

Since the fourth and fifth trenches TR4 and TR5 are formed in different processes, a shape (e.g., a profile of the sidewall) of the fifth trench TR5 in a cross-sectional view may be different from a shape (e.g., a profile of the sidewall of) the fourth trench TR4 in the cross-sectional view. The slope of the sidewall of the fifth trench TR5 may be different from the slope of the sidewall of the fourth trench TR4.

Figure 24:
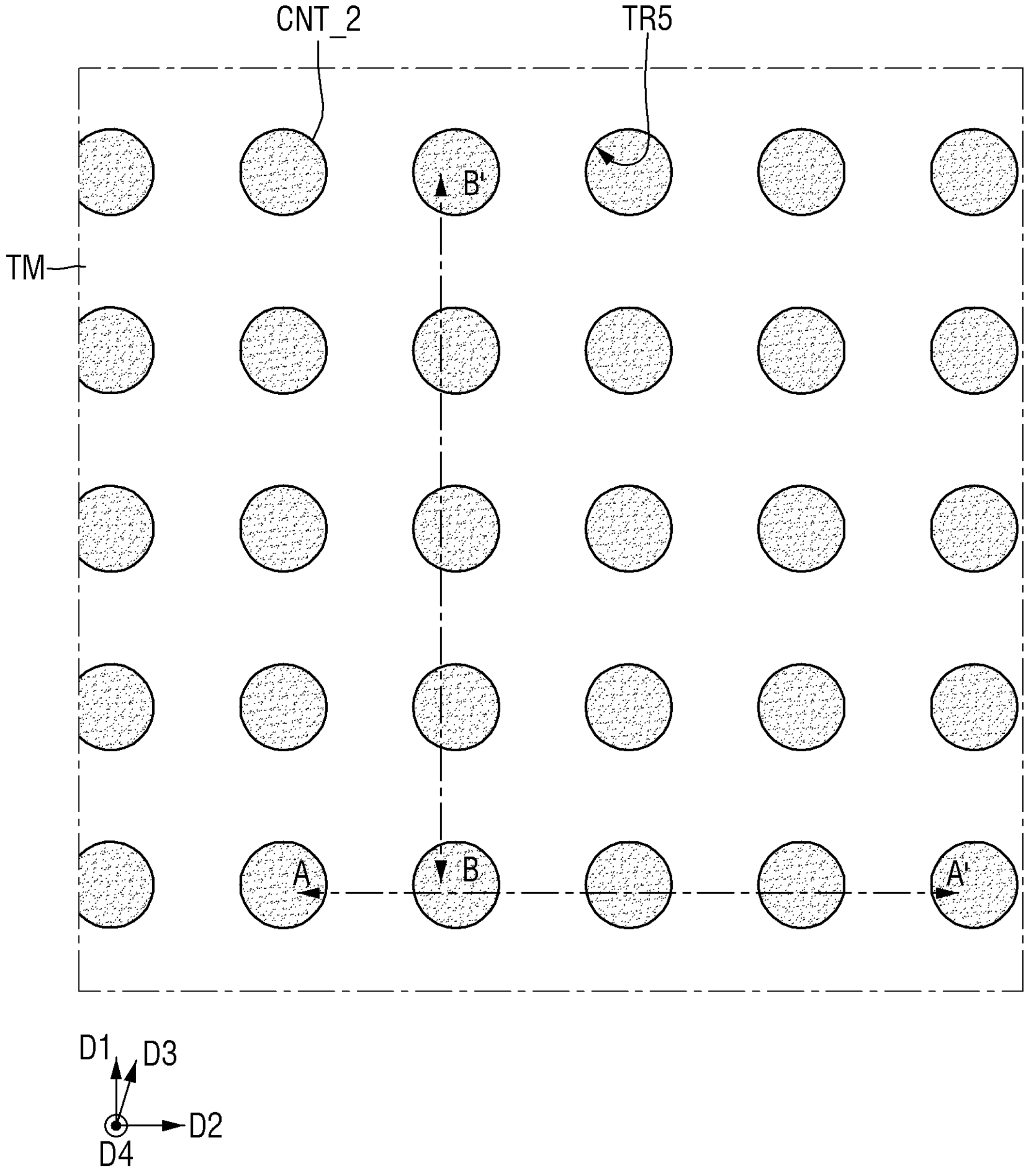
Figure 25A:
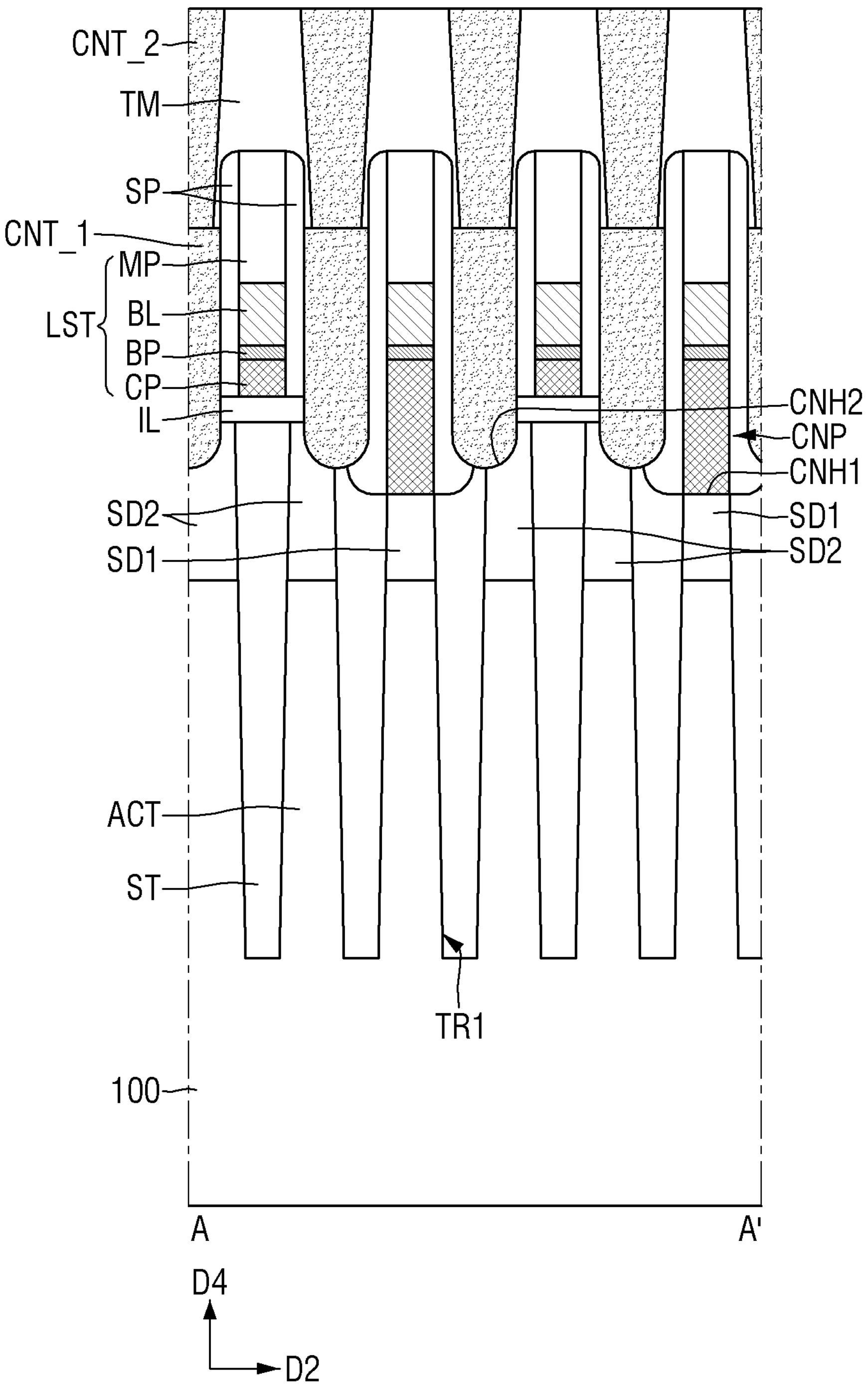
Figure 25B:
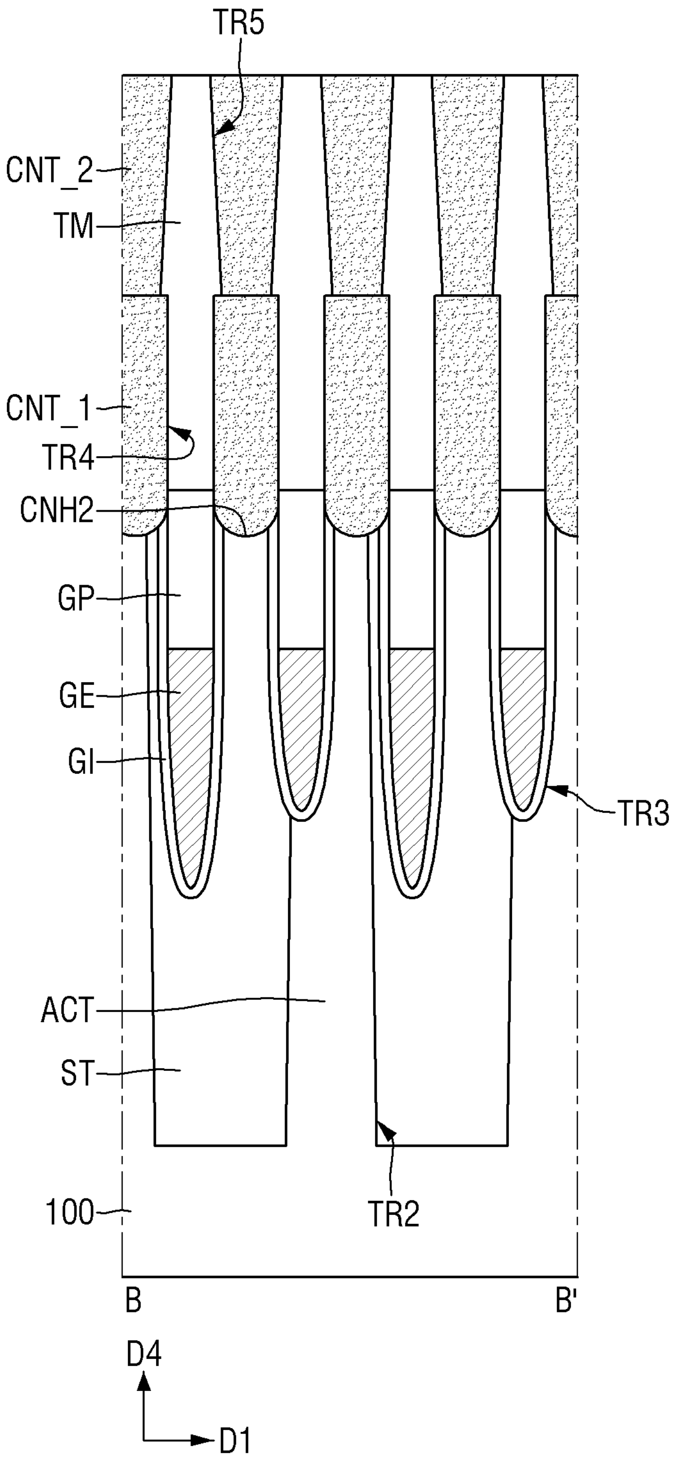

Referring to FIG. 24, FIG. 25A, and FIG. 25B, the second contacts CNT_2 filling (e.g., at least partially filling) the fifth trenches TR5 may be respectively formed on the first contacts CNT_1. In this way, the conductive materials may be isolated from each other via the mold layer TM. Accordingly, as shown in FIG. 1 to FIG. 3, the contacts CNT and the insulating patterns INP may be alternately arranged with each other along the first direction D1 and the second direction D2.

Although not specifically shown, each of the first electrodes, each of the dielectric film, and each of the second electrodes may be formed on each of the contacts CNT. Each of the first electrodes, each of the dielectric films, and each of the second electrodes may constitute each information storage element, for example, each capacitor.

Accordingly, the semiconductor memory device as shown in FIG. 1 and FIG. 2A to FIG. 2B may be manufactured.

Figure 26:
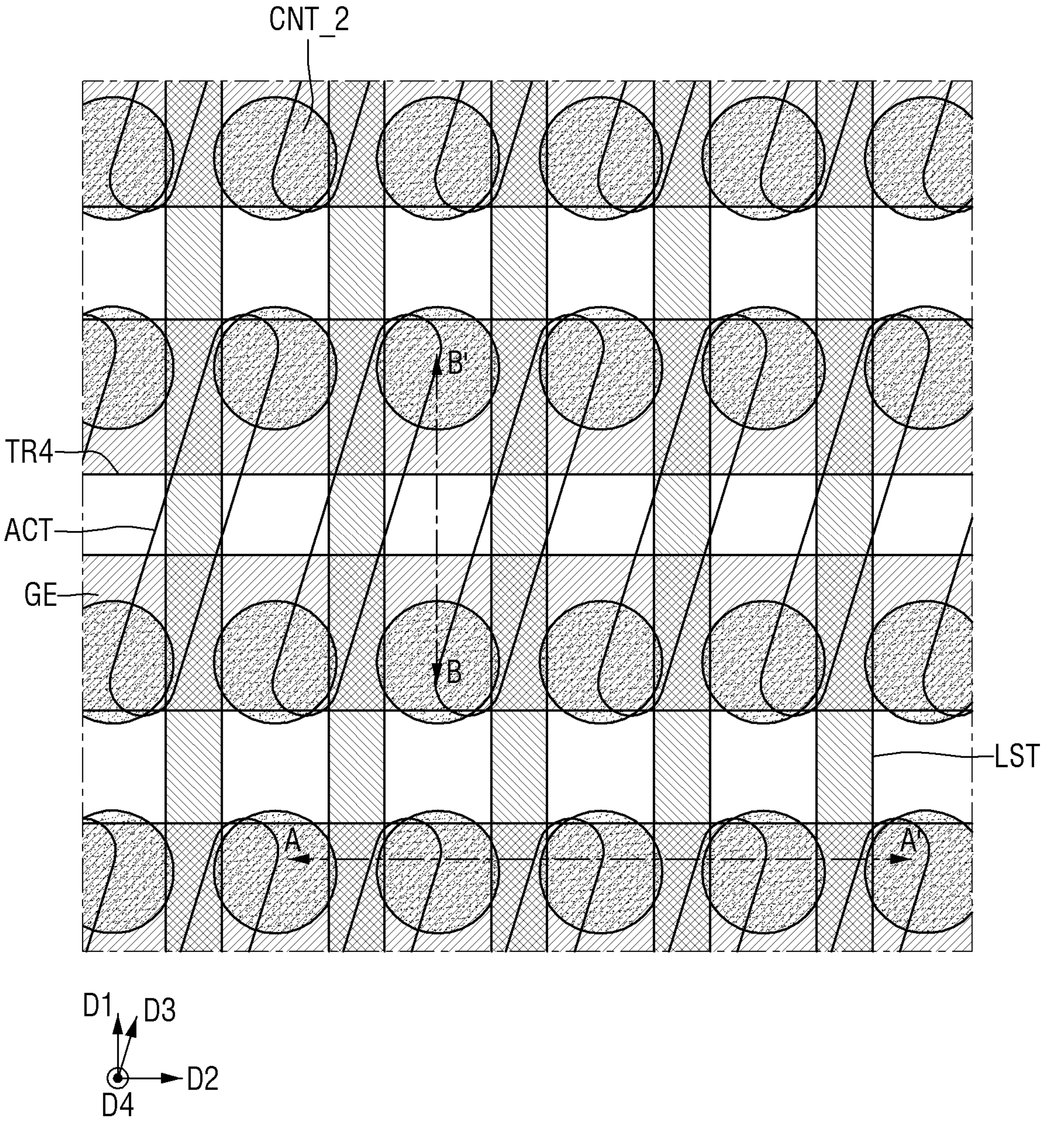
FIG. 26 is a schematic layout diagram of a semiconductor memory device according to some embodiments.
Figure 27A:
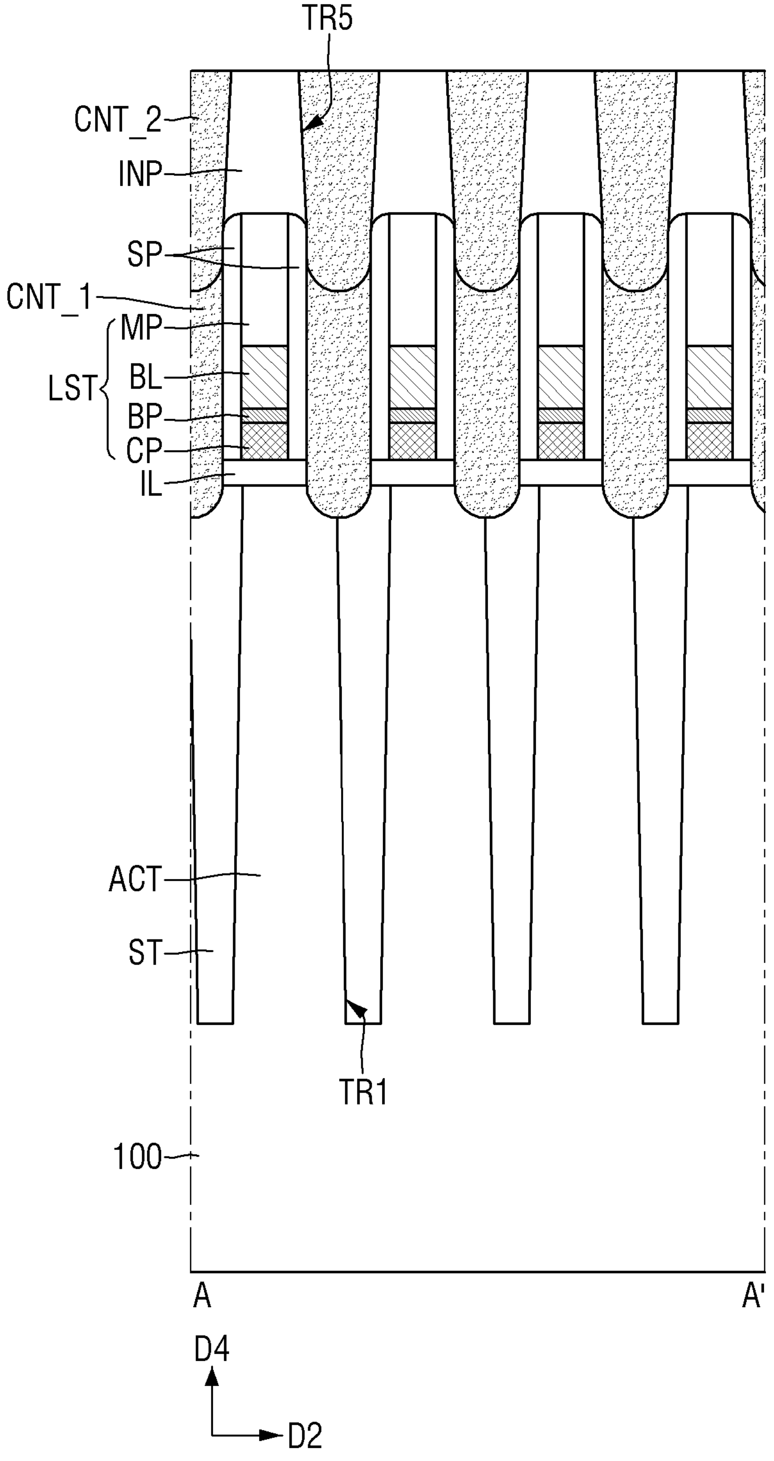
FIG. 27A is an illustrative cross-sectional view taken along a line A-A' of FIG. 26.
Figure 27B:
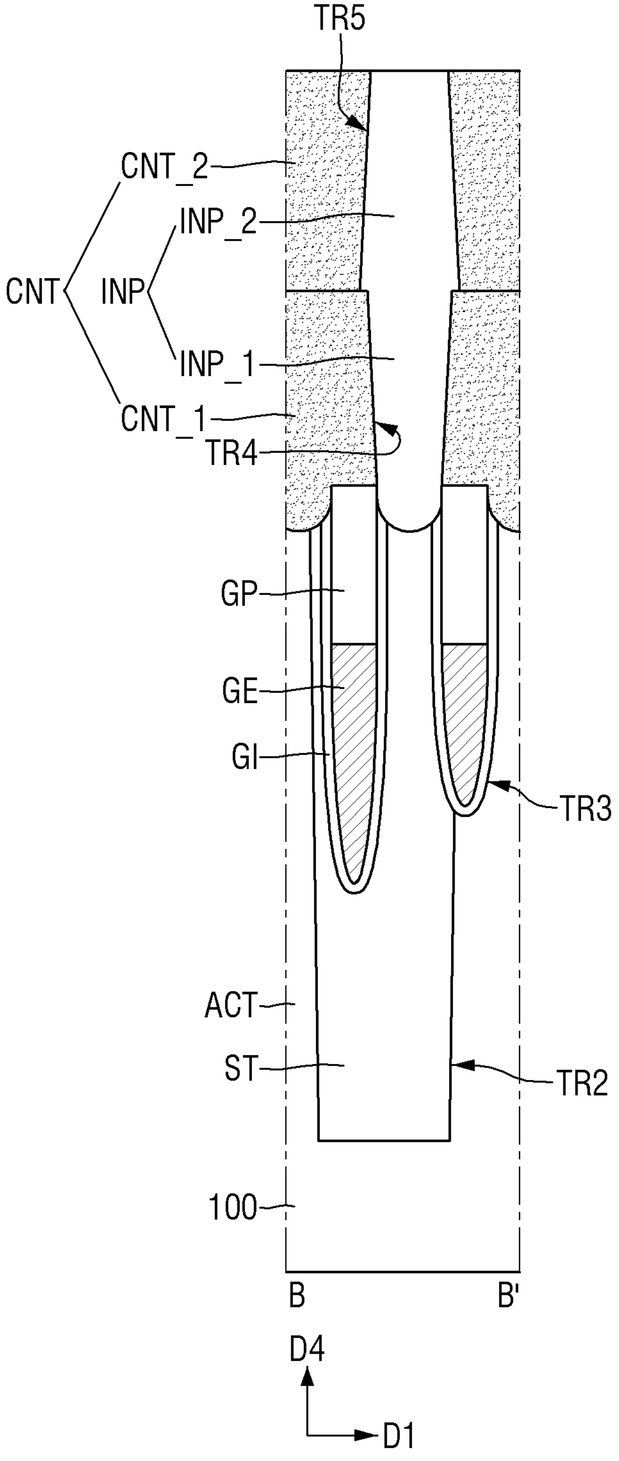
FIG. 27B is an illustrative cross-sectional view taken along a line B-B' of FIG. 26.
Figure 28:
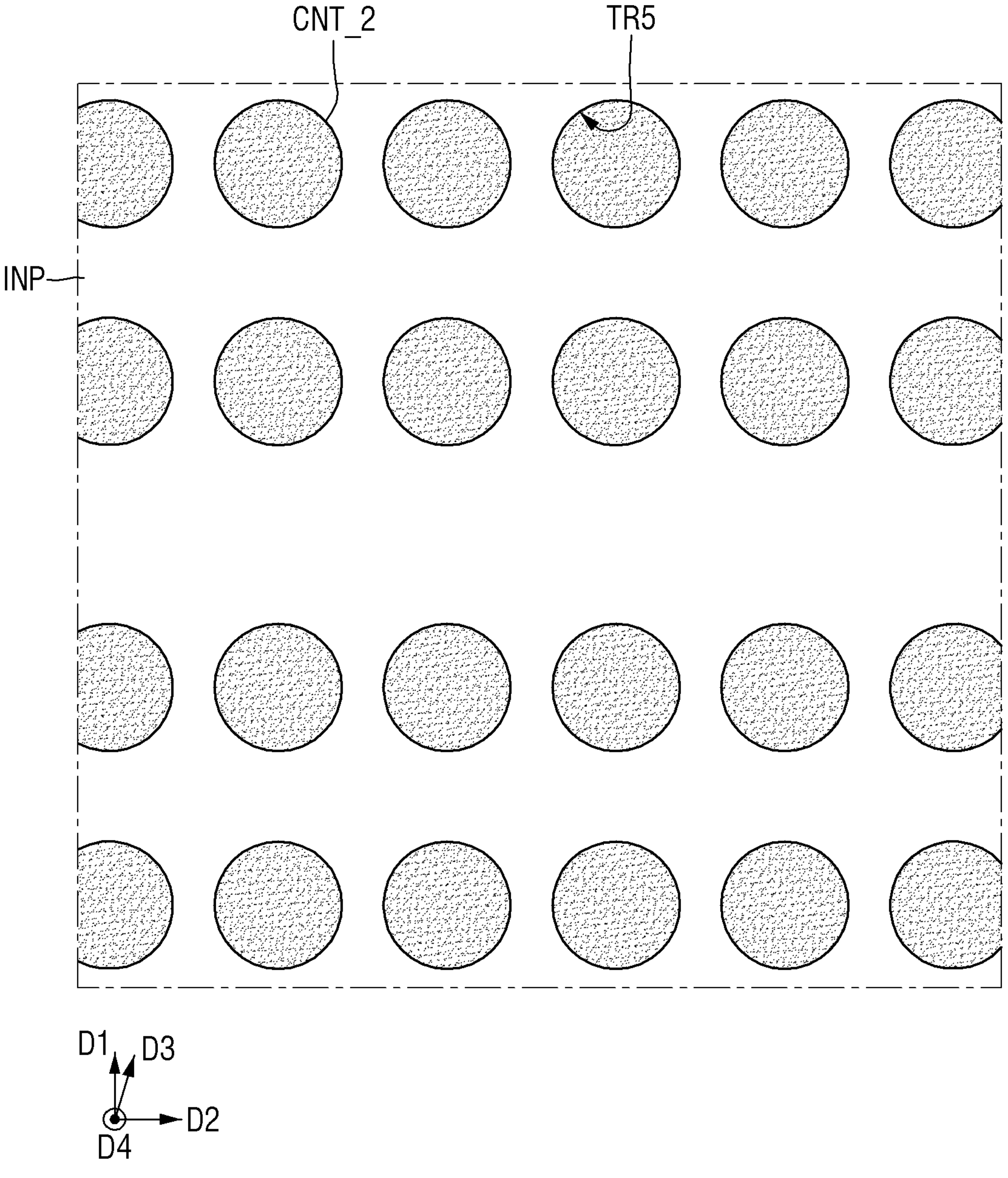
FIG. 28 is a top view of a semiconductor memory device according to some embodiments.

FIG. 26 is a schematic layout diagram of a semiconductor memory device according to some embodiments. FIG. 27A is an illustrative cross-sectional view taken along a line A-A' of FIG. 26. FIG. 27B is an illustrative cross-sectional view taken along a line B-B' of FIG. 26. FIG. 28 is a plan view (e.g., a top view) of a semiconductor memory device according to some embodiments. For reference, FIG. 28 may be a plan view (e.g., a top view) of the semiconductor memory device of FIGS. 27A and 27B. For convenience of description, differences from those described above with reference to FIG. 1 to FIG. 25B will be described.

Referring to FIG. 26, in a plan view, the active patterns ACT may be two-dimensionally arranged as (e.g., along) a plurality of rows and a plurality of columns. Each of the active patterns ACT may extend in the third direction D3 and in a parallel manner to the upper surface of the substrate 100. Each of the active patterns ACT may have a major axis in the third direction D3.

An end of one active pattern ACT may be adjacent to an end of another active pattern ACT adjacent thereto. An end of one active pattern ACT may be adjacent to an end of another active pattern ACT adjacent thereto in the second direction D2. The contact CNT may not be disposed so as to be adjacent to the center of the active pattern ACT.

The gate electrode GE may extend along one row extending in the second direction D2 and extend across adjacent active patterns ACT. The gate electrode GE may not be disposed between an end of one active pattern ACT and an end of another active pattern ACT adjacent to each other in the first direction D1 or the third direction D3.

The bit-line structure LST may extend along one column extending in the first direction D1 and may intersect the active patterns ACT adjacent to each other.

The contacts CNT may be arranged two-dimensionally along the first direction D1 and the second direction D2. The insulating pattern INP may be disposed in an area between the gate capping films GP in which the contacts CNT are not disposed.

Hereinafter, a method for manufacturing a semiconductor memory device according to some embodiments is described using FIG. 29 to FIG. 34B. For convenience of description, differences from those described above with reference to FIG. 4 to FIG. 25B and FIG. 26 to FIG. 28 will be described.

Figure 29:
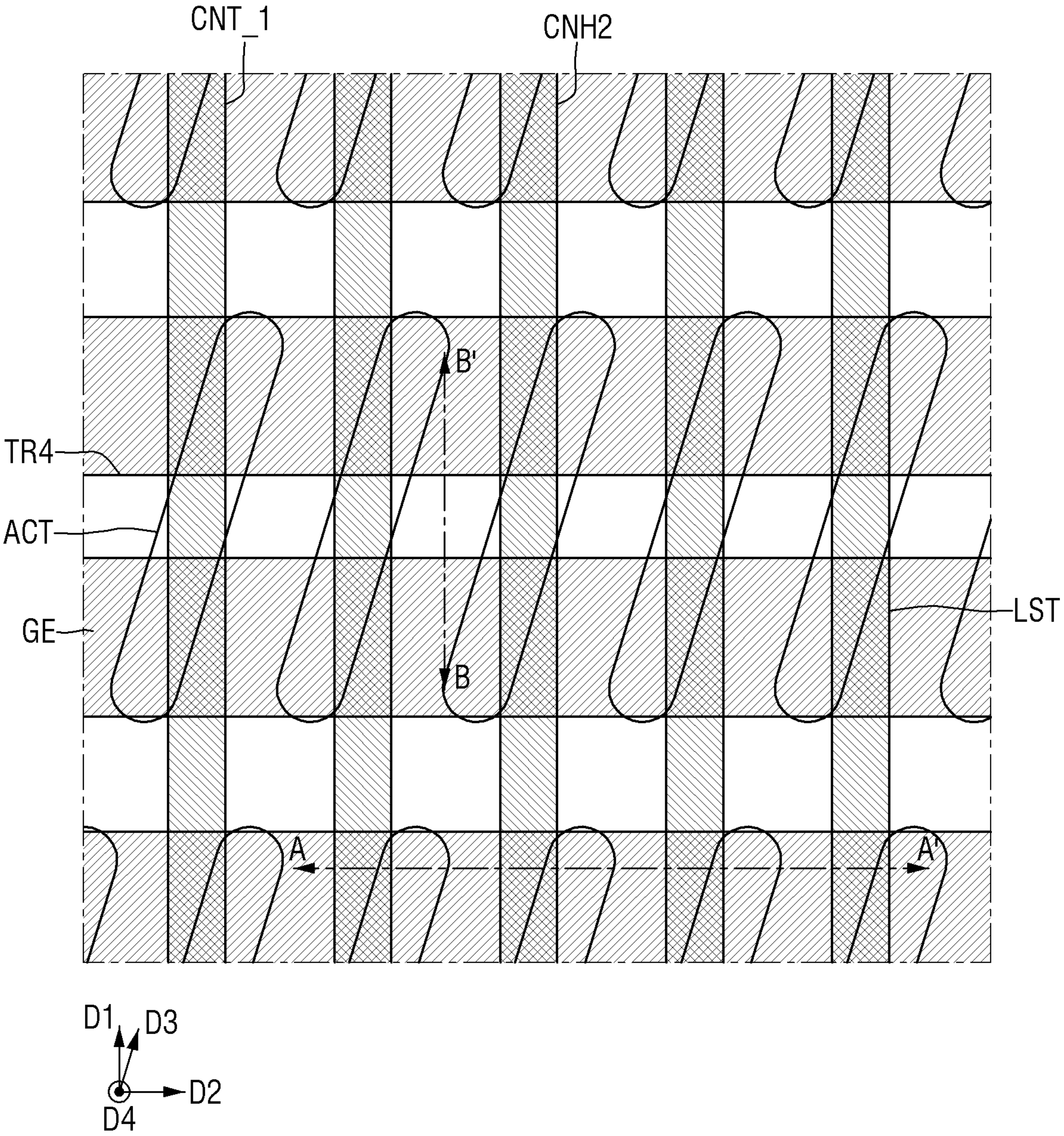
FIG. 29, FIG. 31, and FIG. 33 are plan views for illustrating a method for manufacturing a semiconductor memory device according to some embodiments.
Figure 30A:
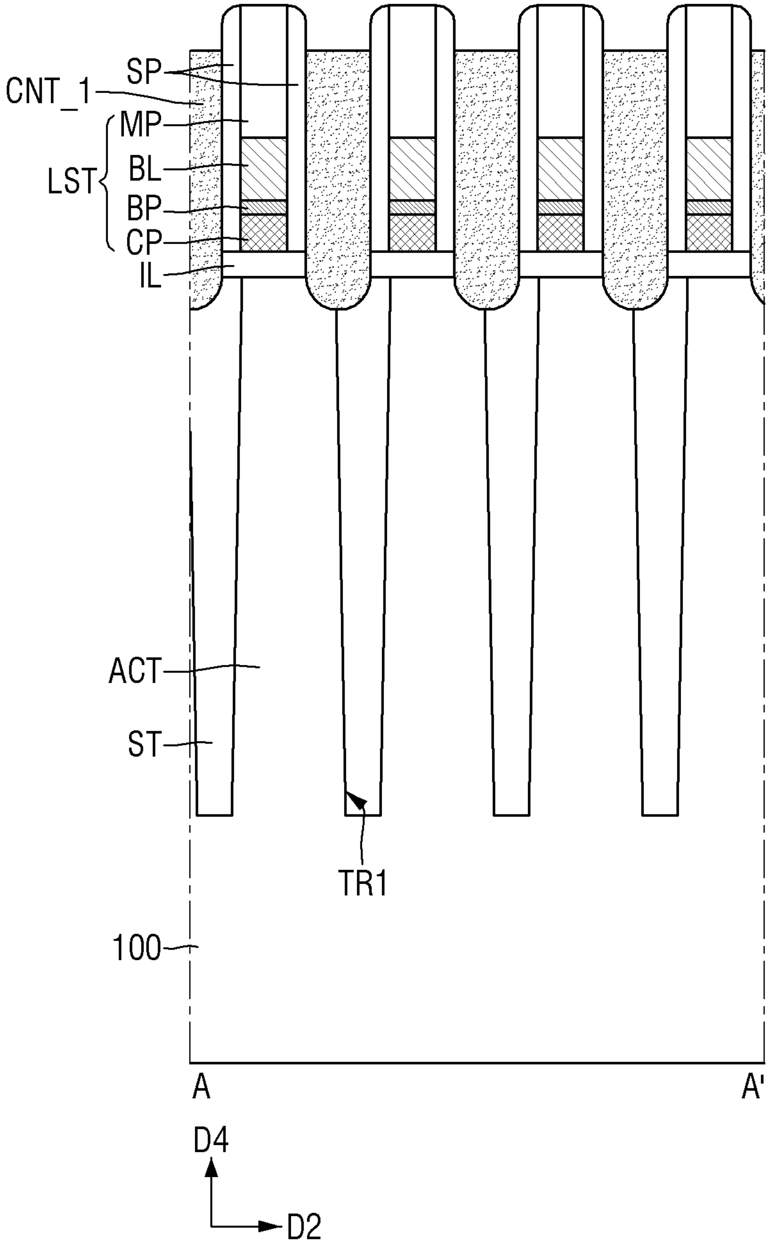
FIG. 30A, FIG. 32A, and FIG. 34A are cross-sectional views along lines A-A' of FIG. 29, FIG. 31, and FIG. 33, respectively.
Figure 30B:
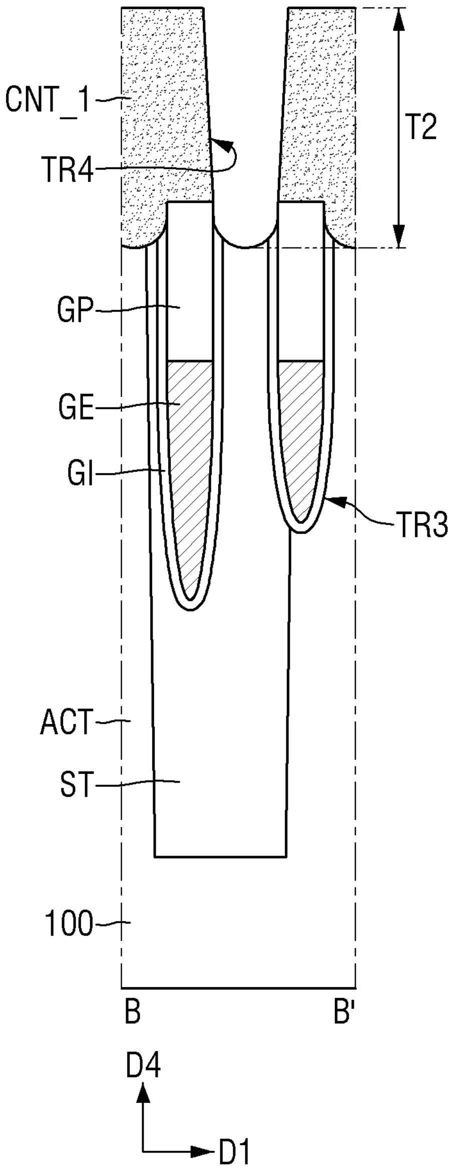
FIG. 30B, FIG. 32B, and FIG. 34B are cross-sectional views taken along lines B-B' of FIGS. 29, 31, and 33, respectively.
Figure 31:
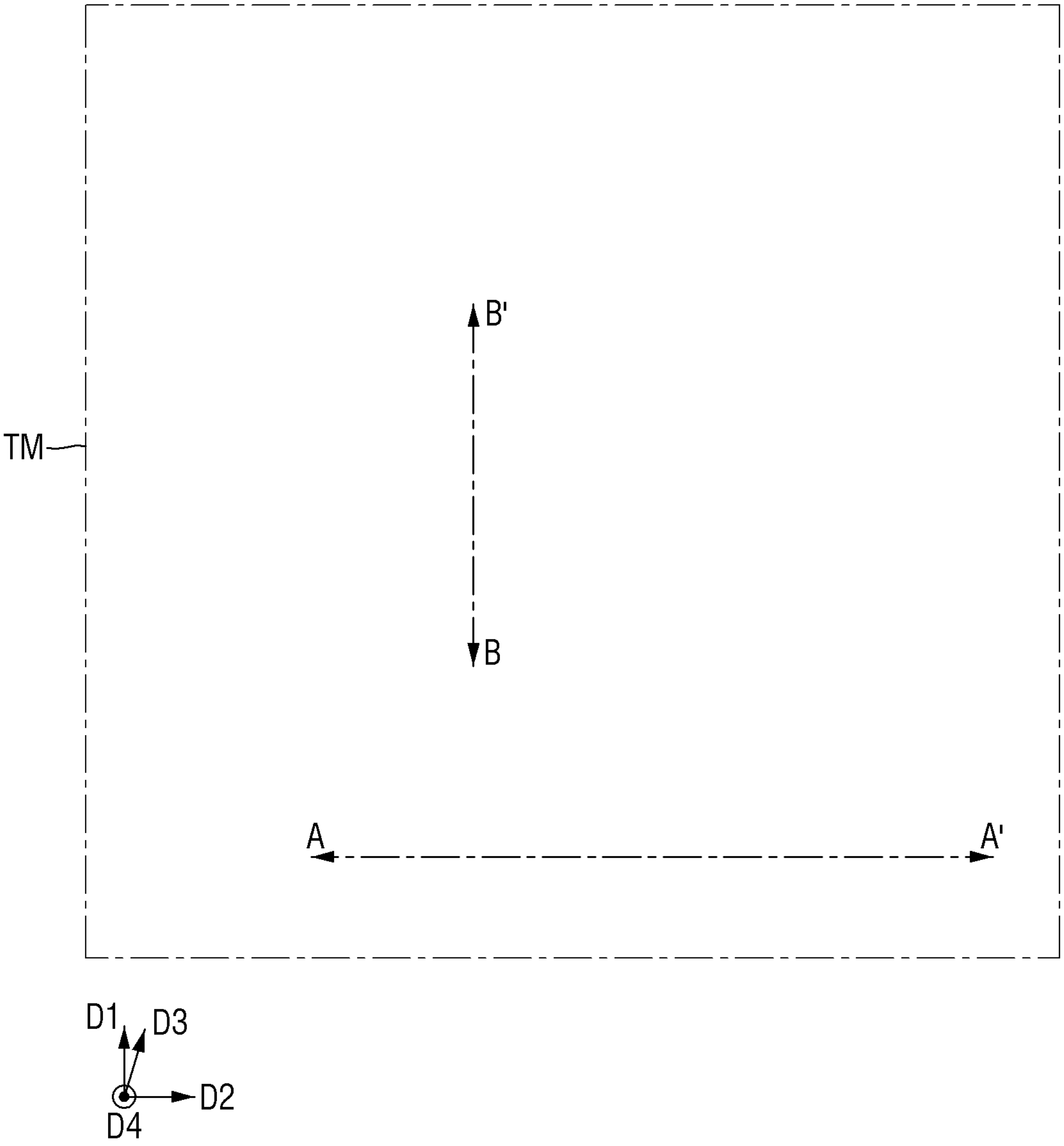
Figure 32A:
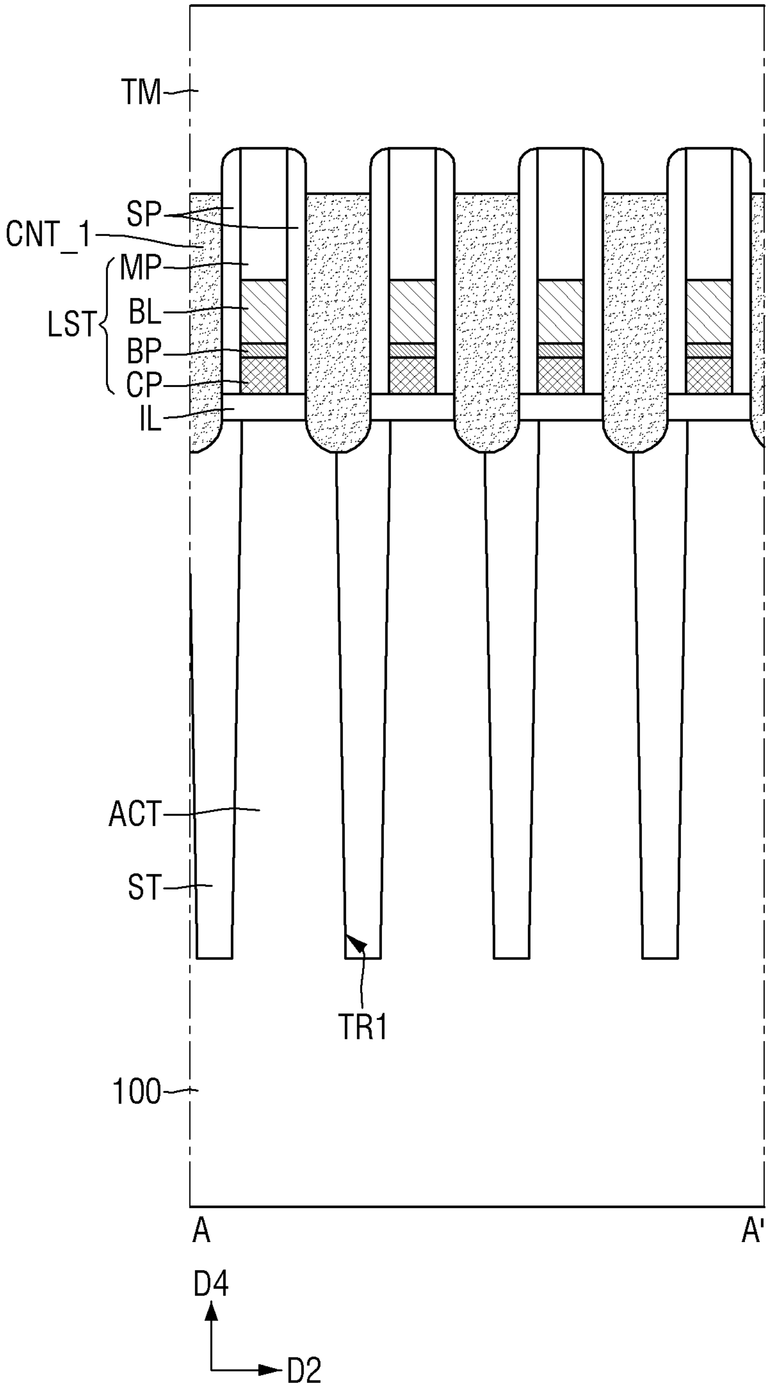
Figure 32B:
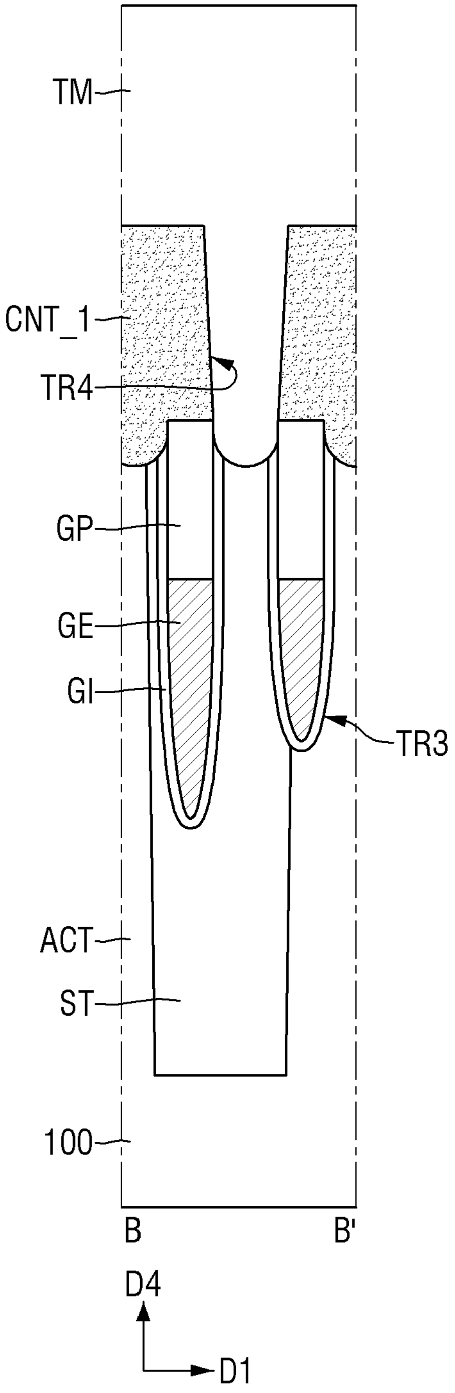
Figure 33:
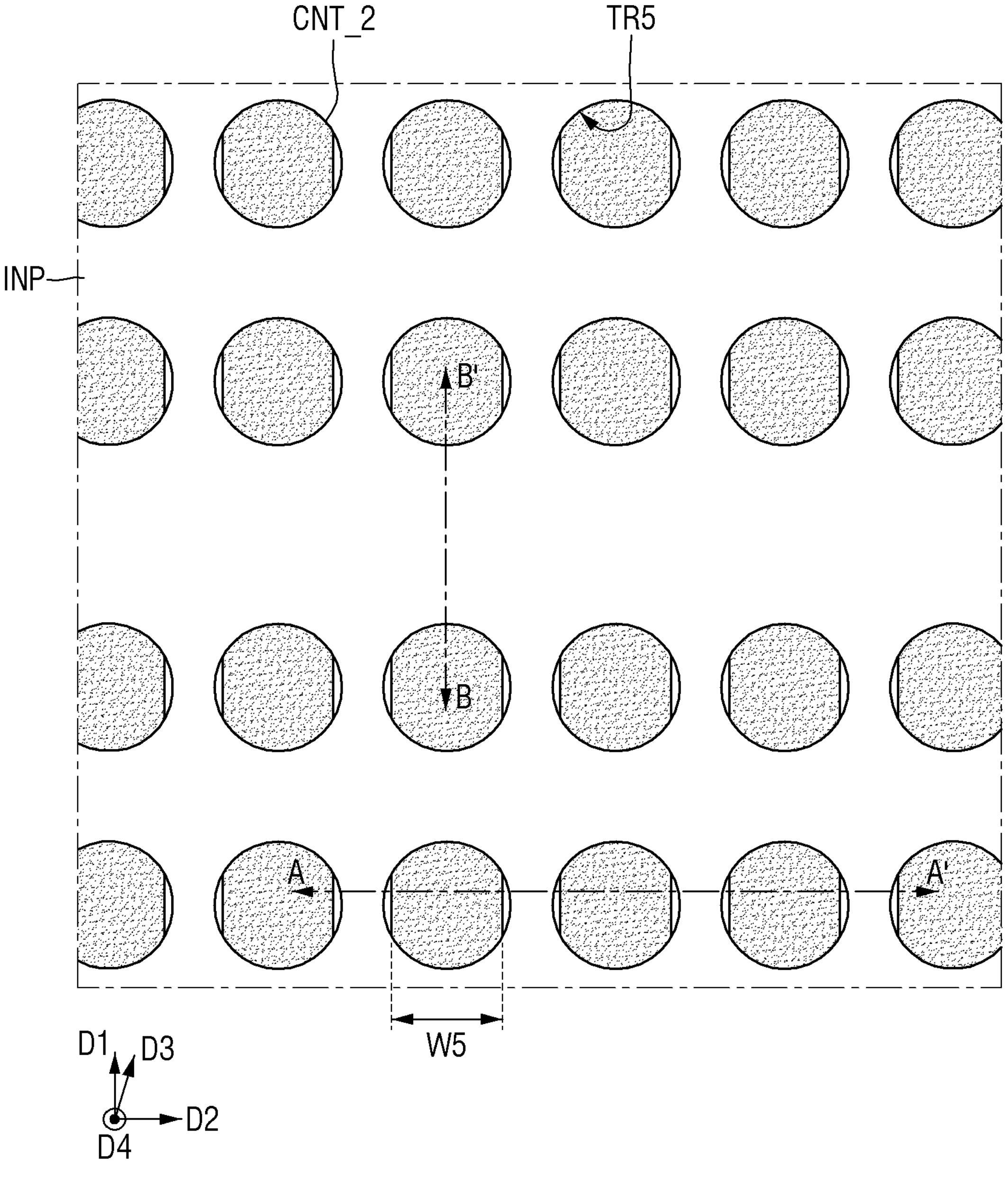
Figure 34A:
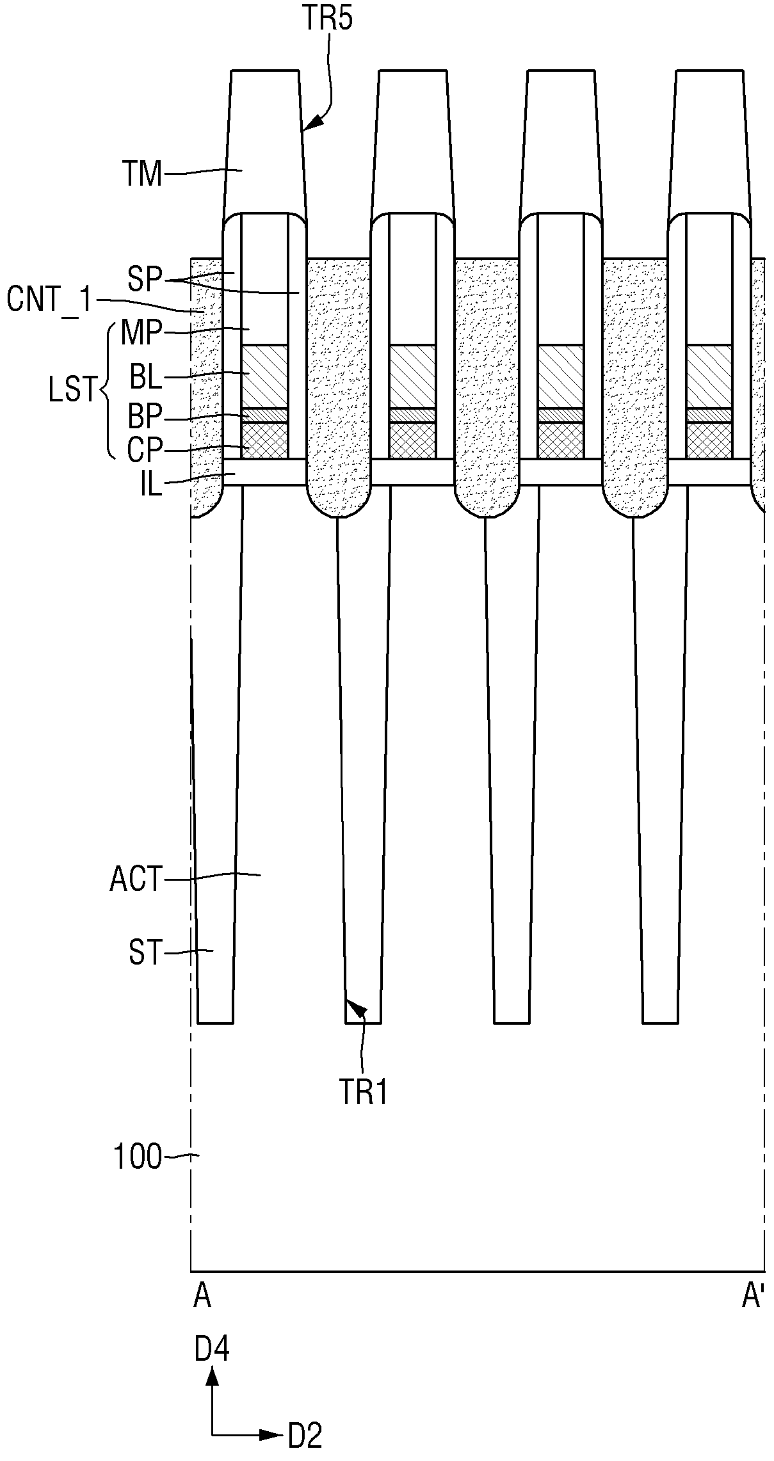
Figure 34B:
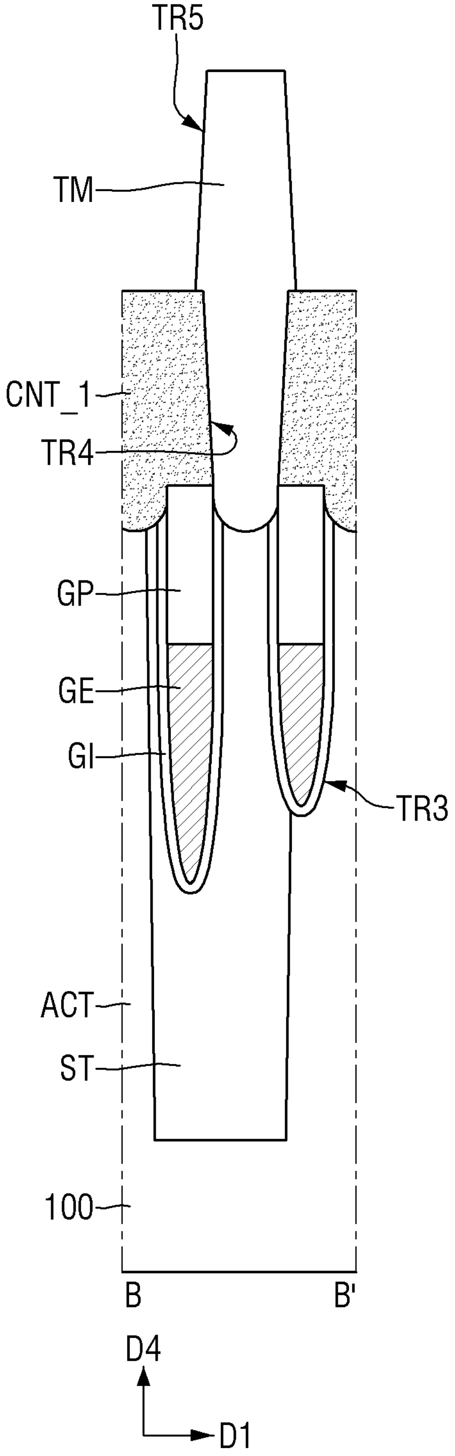

FIG. 29, FIG. 31, and FIG. 33 are plan views for illustrating a method for manufacturing a semiconductor memory device according to some embodiments. FIG. 30A, FIG. 32A, and FIG. 34A are cross-sectional views along lines A-A' of FIG. 29, FIG. 31, and FIG. 33, respectively. FIG. 30B, FIG. 32B, and FIG. 34B are cross-sectional views taken along lines B-B' of FIGS. 29, 31, and 33, respectively.

Referring to FIG. 29, FIG. 30A, and FIG. 30B, the first contacts CNT_1 may be etched to form the fourth trench TR4 exposing the sidewall of the first contacts CNT_1 and at least a portion of the gate capping film GP. For example, a depth T2 of the fourth trench TR4 in the fourth direction D4 may be smaller than 300 Å. However, the present disclosure is not limited thereto.

Referring to FIG. 31, FIG. 32A, and FIG. 32B, the mold layer TM that partially or completely fills the second trench TR4 and covers or overlaps (e.g., overlap in the fourth direction D4) the upper surfaces of the first contacts CNT_1 may be formed.

Referring to FIG. 32A, the mold layer TM may cover or overlap (e.g., overlap in the fourth direction D4) the upper surface of the bit-line structure LST and thus may contact the entirety of the upper surface of the bit-line structure LST. In some embodiments, the mold layer TM may cover or overlap (e.g., overlap in the fourth direction D4) a portion of the side surface of the bit-line structure LST so as to contact the portion of the side surface of the bit-line structure LST.

Referring to FIG. 32B, the mold layer TM may contact the sidewall and the upper surface of each of the first contacts CNT_1 and a portion of the upper surface of the gate capping film GP. For example, the mold layer TM may include silicon nitride. However, the present disclosure is not limited thereto.

Referring to FIG. 33, FIG. 34A, and FIG. 34B, the mold layer TM may be etched to form the fifth trench TR5 exposing the sidewall of the mold layer TM and the upper surface of each of the first contacts CNT_1.

Since the fourth and fifth trenches TR4 and TR5 are formed in different processes, the shape (e.g., the profile of the sidewall) of the fifth trench TR5 in a cross-sectional view may be different from the shape (e.g., the profile of the sidewall) of the fourth trench TR4 in the cross-sectional view. The slope of the sidewall of the fifth trench TR5 may be different from the slope of the sidewall of the fourth trench TR4.

For example, a width W5 of each of the exposed first contacts CNT_1 in the second direction D2 may be smaller than or equal to a width of each of the fifth trench TR5 in the second direction D2.

Thereafter, the second contacts CNT_2 filling (e.g., at least partially filling) the fifth trenches TR5 may be respectively formed on the first contacts CNT_1. In this way, the conductive materials may be isolated from each other via the mold layer TM. Accordingly, the semiconductor memory device as shown in FIG. 26 to FIG. 28 may be manufactured.

Although the embodiments of the present disclosure have been described with reference to the accompanying drawings, the present disclosure is not limited to the above embodiments and may be implemented in various different forms. Those of ordinary skill in the technical field to which the present disclosure belongs will be able to understand that the present disclosure may be implemented in other specific forms without changing the technical idea or essential characteristics of the present disclosure. Therefore, it should be understood that the embodiments as described above are not restrictive but illustrative in all respects.

What is claimed is:

1. A semiconductor memory device comprising:
a substrate including a plurality of active patterns;
a gate structure that extends into the substrate, wherein the gate structure extends in a first direction to intersect the plurality of active patterns;
a plurality of bit-line structures on the substrate, wherein a bit-line structure among the plurality of bit-line structures extends in a second direction that intersects the first direction;
a plurality of first contacts, wherein the plurality of bit-line structures and the plurality of first contacts are alternately arranged with each other in the first direction;
a plurality of insulating patterns respectively disposed on the plurality of bit-line structures, wherein an insulating pattern among the plurality of the insulating patterns is disposed in a first trench exposing a sidewall of a first contact among the plurality of first contacts and at least a portion of the gate structure; and
a plurality of second contacts respectively disposed on the plurality of first contacts, wherein a second contact among the plurality of second contacts is disposed in a second trench exposing a sidewall of the insulating pattern and an upper surface of the first contact,
wherein the first and second directions are parallel with an upper surface of the substrate, and
wherein the insulating pattern overlaps an upper surface of the bit-line structure and extends along a sidewall of each of the first and second trenches and contacts each of the first and second contacts.

2. The semiconductor memory device of claim 1, wherein the insulating pattern includes:
a first area in contact with the first contact; and
a second area on the first area and in contact with the second contact,
wherein a cross-sectional shape of the first area is different from a cross-sectional shape of the second area.

3. The semiconductor memory device of claim 2, wherein the first and second areas include a same material as each other.

4. The semiconductor memory device of claim 2, wherein a width of an upper surface of the second area is less than a width of a lower surface of the second area.

5. The semiconductor memory device of claim 2, wherein a width of a lower surface of the second area is greater than a width of an upper surface of the first area.

6. The semiconductor memory device of claim 1, wherein a width of a lower surface of the second contact is less than a width of an upper surface of the second contact.

7. The semiconductor memory device of claim 1, wherein the sidewall of the first trench and the sidewall of the second trench have different inclinations from each other,
wherein the sidewall of the first contact and a sidewall of the second contact have different inclinations from each other.

8. The semiconductor memory device of claim 1, wherein the insulating pattern is a unitary structure along the sidewall of the first trench and the sidewall of the second trench.

9. The semiconductor memory device of claim 1, wherein in a plan view, the plurality of active patterns are arranged in a zigzag pattern.

10. The semiconductor memory device of claim 1, wherein in a plan view, the plurality of active patterns are arranged as a plurality of rows and a plurality of columns.

11. A semiconductor memory device comprising:
a substrate including active patterns that include respective source/drain areas;
gate structures in the substrate, wherein the gate structures extend in a first direction and intersect the active patterns;
bit-line structures on the substrate, wherein the bit-line structures extend in a second direction that intersects the first direction;
a first contact between adjacent ones of the bit-line structures, wherein the first contact is electrically connected to one of the respective source/drain areas;
an insulating pattern on a bit-line structure among the bit-line structures, wherein the insulating pattern is in a first trench that exposes a sidewall of the first contact and a portion of a gate structure among the gate structures; and
a second contact on the first contact, wherein the second contact is in a second trench that exposes a sidewall of the insulating pattern and an upper surface of the first contact, wherein the first and second directions are parallel with an upper surface of the substrate, wherein the insulating pattern includes:

a first area in contact with the first contact; and a second area that is on the first area and in contact with the second contact, wherein the second area is in contact with an upper surface of the bit-line structure, and wherein the first and second areas are respectively on sidewalls of the first and second trenches and respectively extend along the sidewalls of the first and second trenches.

12. The semiconductor memory device of claim 11, wherein a sidewall of the first area and a sidewall of the second area have different inclinations from each other.

13. The semiconductor memory device of claim 11, wherein the sidewall of the first trench and the sidewall of the second trench have different inclinations from each other, and wherein the sidewall of the first contact and a sidewall of the second contact have different inclinations from each other.

14. The semiconductor memory device of claim 11, wherein the bit-line structure and the insulating pattern overlap each other in a third direction that is perpendicular to the upper surface of the substrate, wherein the first area and the second area overlap each other in the third direction.

15. The semiconductor memory device of claim 11, wherein each of the first and second areas includes silicon nitride.

16. The semiconductor memory device of claim 11, wherein a width of the second trench increases as the second trench extends away from the substrate.

17. The semiconductor memory device of claim 11, wherein in a plan view, the active patterns are arranged as a plurality of rows and a plurality of columns.

18. A semiconductor memory device comprising:

a substrate including a plurality of active patterns that include respective first source/drain area and respective second source/drain area;

an insulating film on the substrate;

a gate structure in the substrate, wherein the gate structure extends in a first direction to intersect the plurality of active patterns;

a bit-line structure on the insulating film, wherein the bit-line structure extends in a second direction that intersects the first direction, and wherein the bit-line structure extends through the insulating film to be electrically connected to the respective first source/drain area;

a first contact spaced apart from the bit-line structure in the first direction, wherein the first contact is electrically connected to the respective second source/drain area;

an insulating pattern on an upper surface of the bit-line structure and an upper surface of the gate structure; and a second contact on the first contact, wherein the second contact is electrically connected to the first contact, wherein the first and second directions are parallel with an upper surface of the substrate, wherein the insulating pattern overlaps the bit-line structure in a third direction and extends to the upper surface of the gate structure, wherein the third direction is perpendicular to the upper surface of the substrate, and wherein the insulating pattern is in contact with the first and second contacts.

19. The semiconductor memory device of claim 18, wherein the insulating pattern includes:

a first area in contact with the first contact; and a second area on the first area and in contact with the second contact, wherein a cross-sectional shape of the first area is different from a cross-sectional shape of the second area.

20. The semiconductor memory device of claim 18, wherein the insulating pattern is in a first trench that is on the bit-line structure and that exposes a sidewall of the first contact and a portion of the gate structure, wherein the second contact is in a second trench that is on the first contact and that exposes a sidewall of the insulating pattern and an upper surface of the first contact, wherein the insulating pattern integrally extends along sidewalls of the first and second trenches.

* * * * *